(12) United States Patent
Trifonov et al.

(10) Patent No.: US 12,372,591 B2
(45) Date of Patent: Jul. 29, 2025

(54) WIDE BANDWIDTH HALL SENSING CIRCUITRY WITH OFFSET COMPENSATION AND GAIN CALIBRATION

(71) Applicant: Texas Instruments Incorporated, Dallas, TX (US)

(72) Inventors: Dimitar Trifonov, Vail, AZ (US); Chao-Hsiuan Tsay, Tucson, AZ (US); Chase Mackenzie Puglisi, Tucson, AZ (US); Arup Polley, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 178 days.

(21) Appl. No.: 18/228,556

(22) Filed: Jul. 31, 2023

(65) Prior Publication Data
US 2024/0337708 A1 Oct. 10, 2024

Related U.S. Application Data

(60) Provisional application No. 63/457,444, filed on Apr. 6, 2023, provisional application No. 63/457,441, filed on Apr. 6, 2023.

(51) Int. Cl.
*G01R 33/00* (2006.01)
*G01R 33/07* (2006.01)

(52) U.S. Cl.
CPC ..... *G01R 33/0035* (2013.01); *G01R 33/0029* (2013.01); *G01R 33/075* (2013.01)

(58) Field of Classification Search
CPC ............ G01R 33/0035; G01R 33/0029; G01R 33/075; G01R 33/0017
See application file for complete search history.

(56) References Cited

U.S. PATENT DOCUMENTS 11,307,267 B1 * 4/2022 Polley ................ G01R 33/0035
2013/0265036 A1 * 10/2013 Friedrich ........... G01R 33/0094
324/207.13

(Continued)

OTHER PUBLICATIONS

International Search Report for PCT/US2024/023216, dated Sep. 11, 2024.

(Continued)

*Primary Examiner* — Alvaro E Fortich
(74) *Attorney, Agent, or Firm* — Mandy Barsilai Fernandez; Frank D. Cimino

(57) ABSTRACT

Methods, apparatus, systems, and articles of manufacture are described corresponding to wide bandwidth hall sensing circuitry. An example circuit includes a first hall effect sensor configured to output a first voltage corresponding to a magnetic field; an amplifier to output an amplified voltage by amplifying the first voltage; a second hall effect sensor configured to output a second voltage corresponding to the magnetic field, the second hall effect sensor operating using a spinning technique to toggle a bias current between terminals of the second hall effect sensor, the spinning technique to remove a first offset corresponding to the second hall effect sensor; and offset reduction circuitry configured to: determine a second offset corresponding to the first hall effect sensor based on the first voltage and the second voltage; and generate an output based on the second offset, the amplifier to adjust the amplified voltage based on the output.

26 Claims, 13 Drawing Sheets

(56) References Cited

U.S. PATENT DOCUMENTS

2017/0363693 A1    12/2017    Polley et al.
2020/0393529 A1*  12/2020    Larson ............... G01R 33/0082
2022/0075008 A1*   3/2022    Romero ................ G01D 5/145
2022/0179015 A1*   6/2022    Polley .................. G01R 33/075

OTHER PUBLICATIONS

Allegro Microsystems, "Automotive-Grade, High-Accuracy, Hall-Effect-Based Current Sensor IC with Common-Mode Field Rejection in High-Isolation SOIC16 Package," dated May 26, 2022, 21 pages.

Allegro Microsystems, "1 MHZ Bandwidth, Galvanically Isolated Current Sensor IC in SOIC-16 Package," dated Sep. 17, 2021, 28 pages.

Jiang et al., "A Multi-Path CMOS Hall Sensor with Integrated Ripple Reduction Loops," in conjuncture with IEEE Asian Solid-State Circuits Conference, dated Nov. 9-11, 2015, 4 pages.

Jiang et al., "Multipath Wide-Bandwidth CMOS Magnetic Sensors," IEEE Journal of Solid-State Circuits, vol. 52, No. 1, dated Jan. 2017, 12 pages.

Jiang et al., "A Continuous-Time Ripple Reduction Technique for Spinning-Current Hall Sensors," IEEE Journal of Solid-State Circuits, vol. 49, No. 7, dated Jul. 2014, 10 pages.

\* cited by examiner

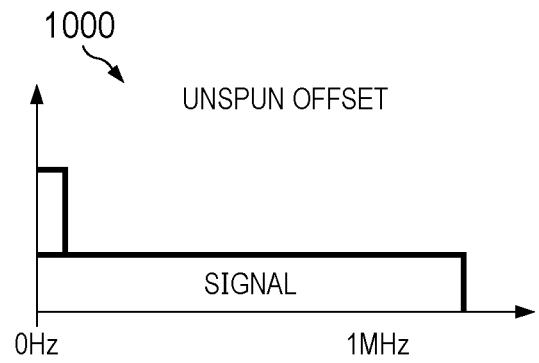
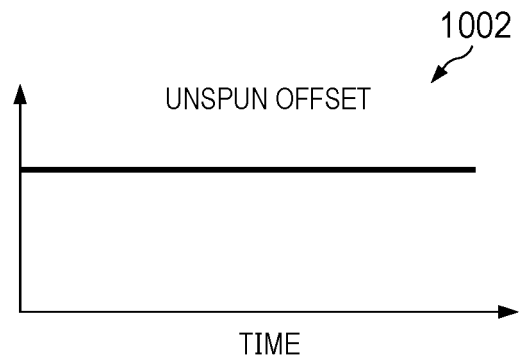
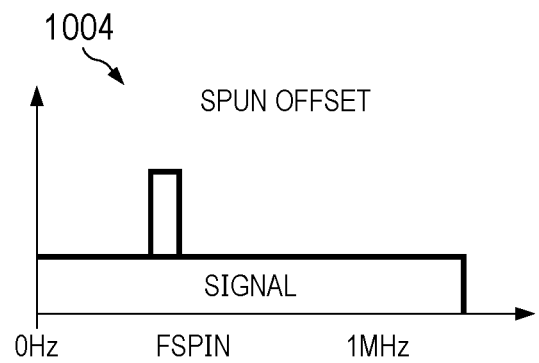
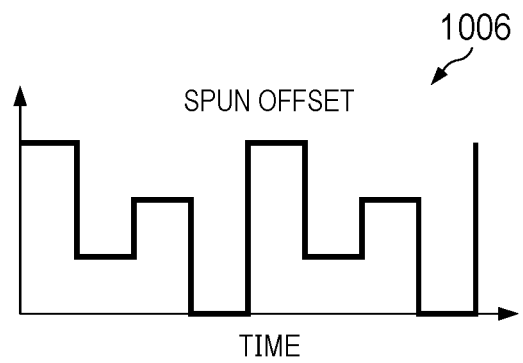
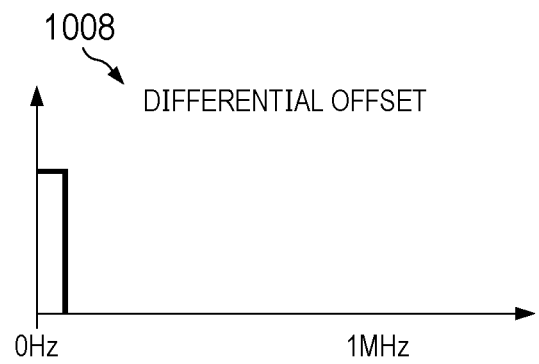
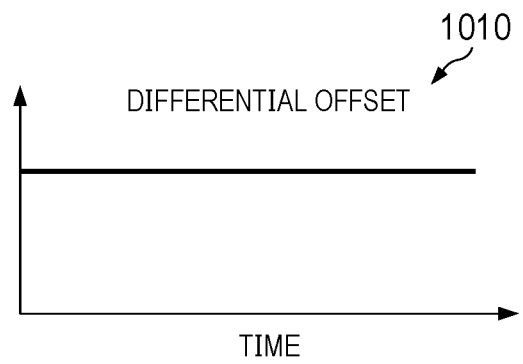
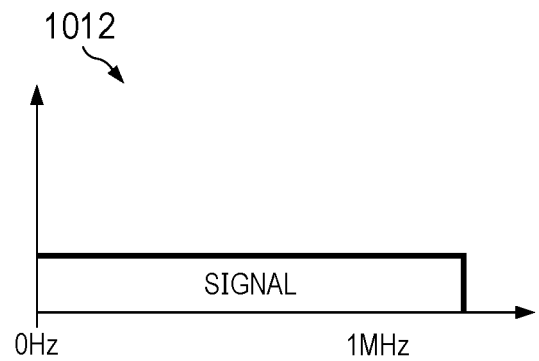
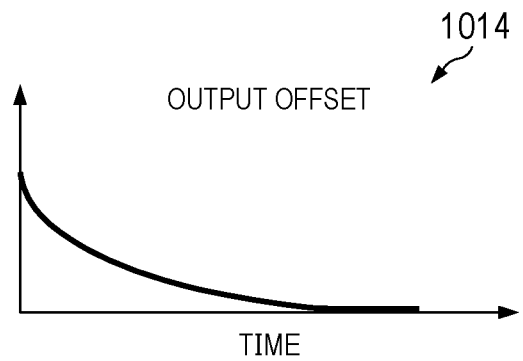
FIG. 10

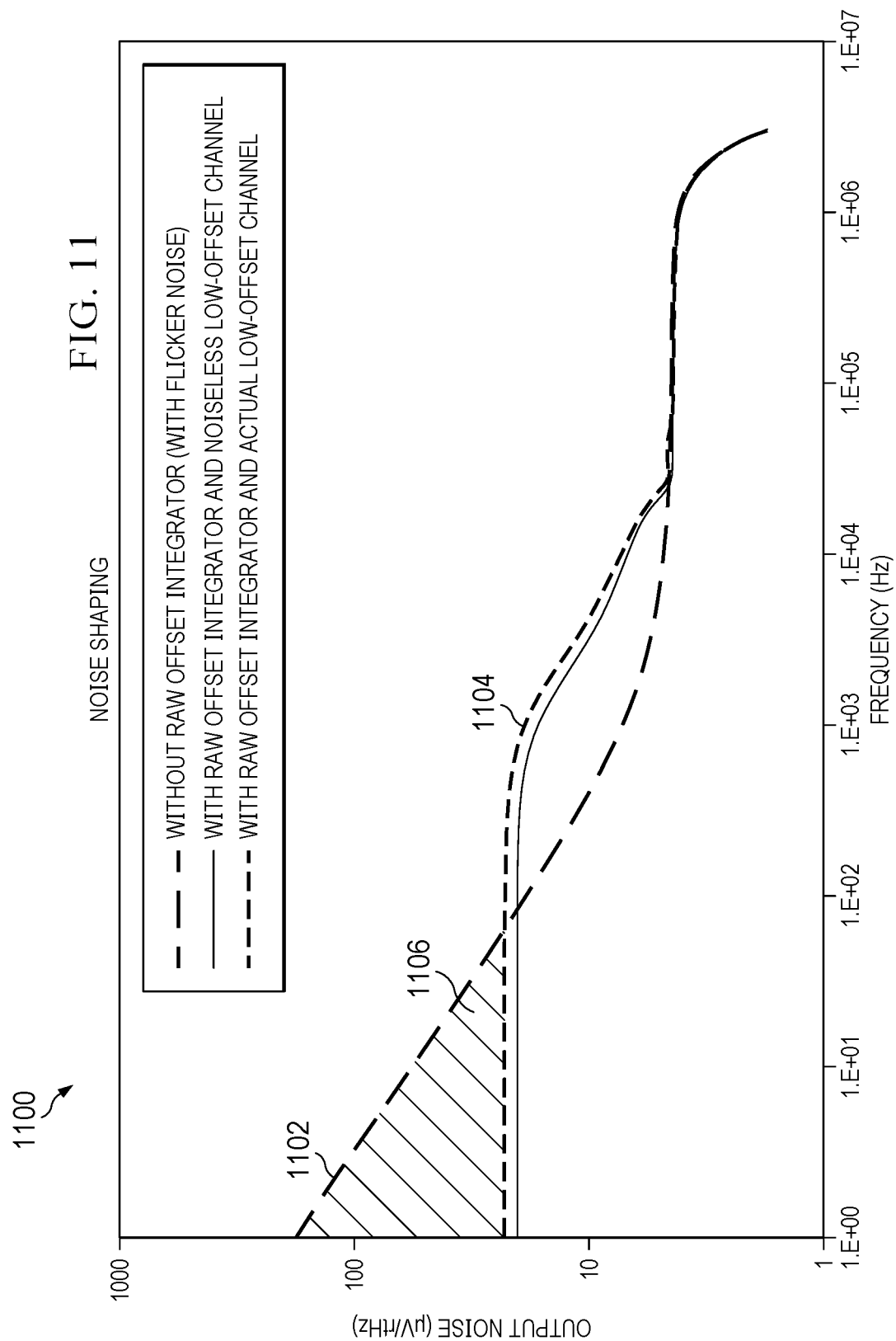

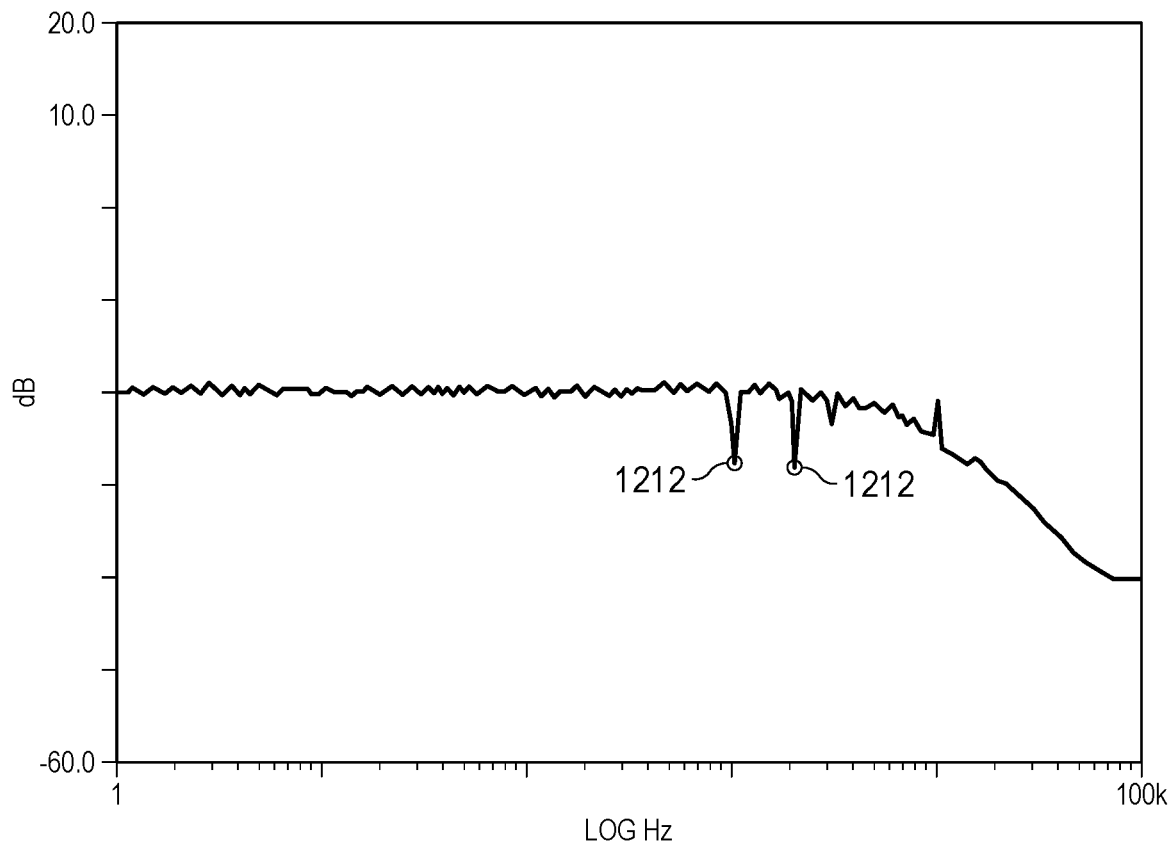

WIDE BANDWIDTH HALL SENSING CIRCUITRY WITH OFFSET COMPENSATION AND GAIN CALIBRATION

CROSS-REFERENCE TO RELATED APPLICATIONS

This patent application claims the benefit of and priority to U.S. Provisional Patent Application Ser. No. 63/457,444 filed Apr. 6, 2023 and U.S. Provisional Patent Application Ser. No. 63/457,441 filed Apr. 6, 2023, which are hereby incorporated herein by reference in their entireties.

FIELD OF THE DISCLOSURE

This disclosure relates generally to circuits, and, more particularly, to wide bandwidth hall sensing circuitry with offset compensation and gain calibration.

BACKGROUND

A hall effect sensor is a sensor that detects the presence and/or magnitude of a magnetic field. Because the flow of current generates a magnetic field, hall effect sensors can be used to determine the amount of current flowing through a system and/or component. To measure a magnetic field with a four terminal hall effect sensor, a bias current is applied into a first terminal and is obtained via a second terminal. A magnetic field caused by current being measured effects the flow of the bias current proportional to the strength of the magnetic field. The effect on the bias current can be measured between the third terminal and the fourth terminal of the Hall effect sensor. For example, if no magnetic field is present, the voltage between the third and fourth terminals are expected to be zero. However, if there is a magnetic field present (e.g., due to current flow), the voltage between the third and fourth terminals is proportional to the magnetic field (e.g., the higher the magnetic field, the higher the voltage differential). Accordingly, the measured voltage at the third terminal and the fourth terminal can be used to determine the amount of current through a component and/or system.

SUMMARY

In at least one example, a circuit includes a first hall effect sensor configured to output a first voltage corresponding to a magnetic field; an amplifier configured to output an amplified voltage by amplifying the first voltage; a second hall effect sensor configured to output a second voltage corresponding to the magnetic field, the second hall effect sensor operating using a spinning technique to toggle a bias current between terminals of the second hall effect sensor, the spinning technique to remove a first offset corresponding to the second hall effect sensor; and offset reduction circuitry configured to: determine a second offset corresponding to the first hall effect sensor based on the first voltage and the second voltage; and generate an output based on the second offset, the amplifier to adjust the amplified voltage based on the output.

BRIEF DESCRIPTION OF THE DRAWINGS

FIG. 10 illustrates timing diagrams corresponding to the hall effect circuitries of FIGS. 1A, 1B, 2, 3, 4A, 4B and/or 5.

FIG. 11 is a diagram illustrating flicker noise reduction corresponding to examples described herein.

FIG. 12B is a diagram illustrating a bandwidth response of some hall effect sensor circuitries.

Figure 1A:
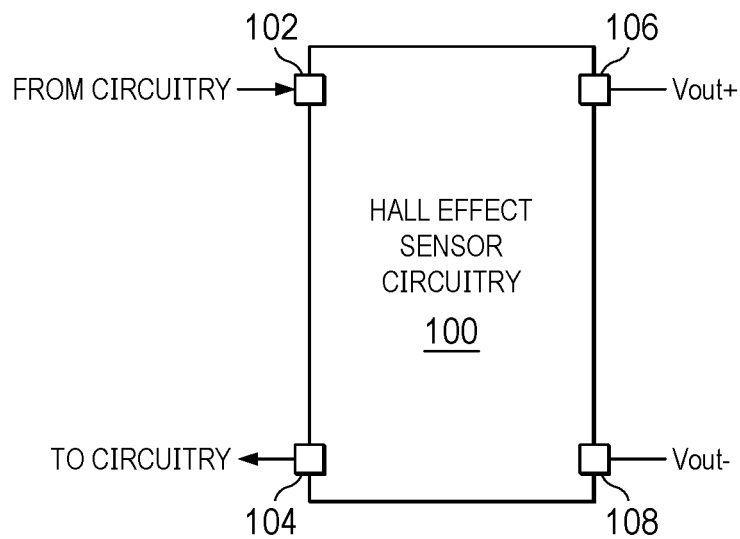
FIGS. 1A and 1B illustrate example hall effect sensor circuitry with offset compensation and gain calibration.

The drawings are not necessarily to scale. The same reference numbers or other reference designators are used in the drawings to designate the same or similar (functionally and/or structurally) features. Although the drawings show regions with clean lines and boundaries, some or all of these lines and/or boundaries may be idealized. In reality, the boundaries and/or lines may be unobservable, blended and/or irregular.

DETAILED DESCRIPTION

Hall effect sensors are used to measure magnetic fields and/or current flow in any system that includes magnetics and/or circuits. For example, hall effect sensors can be used to determine the amount of current flowing through one or more components of an electrical circuit and/or may be used in mechanical devices to determine a speed of a motor with a magnet. Hall effect sensors have two terminals that provide a path for a bias current to flow toward a ground node or terminal and two terminals to measure a voltage differential that can be used to determine the magnetic field. For example, if there is no magnetic field, the voltage differential between the two terminals of the hall effect sensor is 0 (or nearly 0). If a magnetic field is present, the magnetic field affects the bias current flowing between the first two terminals, resulting in a voltage difference between the second two terminals.

Some hall effect sensors may generate a signal, e.g., a small voltage differential between the two terminals even when no magnetic field is applied. This small voltage is referred to as an offset voltage, and the unwanted and unintended signal from the hall sensor when no magnetic field is applied is referred to herein generally as an offset. The undesired offset voltage can be due to unintended variations in the manufacturing process of the hall effect sensor and/or changes in temperature. Responsive to a hall effect sensor being used to measure a current, the magnetic field may be very small. Thus, an amplifier may be used to amplify the voltage differential that the hall effect sensor generates. However, even responsive to the offset voltage being very small, the offset voltage is amplified (e.g., by 100 or 1,000) by the amplifier. Thus, a small offset results in a large offset at the output terminal of the amplifier, thereby decreasing the accuracy of the current measurement.

Some techniques to mitigate the offset of a hall effect sensor includes hall current spinning. Hall current spinning involves rotating the input terminals of the hall effect sensor so that the flow of the bias current is applied to the different input terminals of the hall effect sensor. By rotating the input terminals, the offset associated with each terminal is determined. Also, responsive to the bias current changing directions (e.g., responsive to the bias current being first input into a first terminal and output from a second terminal and then, during a subsequent phase the bias current is provided to the second terminal and output from the first terminal), the polarity of the offset flips. In this manner, the output signal corresponding to each rotation can be added to remove the offset. For example, the first rotation results in a signal with an offset of 1 millivolt (mV), and the second rotation results in a signal with an offset of 2 mV. In such an example, the third rotation results in a signal with an offset of −1 mV (e.g., opposite polarity of the first rotation), and the fourth rotation results in a signal with an offset of −2 mV. Thus, responsive to the signal from the four phases being added together, the offset is eliminated (e.g., 1 mv+2 mV−1 mV−2 mV=0 mV). Hall current spinning may result in high frequency noise related to the frequency of the modulation of phases during the hall current spinning. Thus, such techniques may include a low pass filter, to filter out the high frequency noise. However, a low pass filter lowers the overall bandwidth of the hall effect sensor. Lower bandwidth results in more time to obtain a sensor measurement. Examples described herein mitigate the offset voltage and utilize the full bandwidth of the hall effect sensor by eliminating the low pass filter, thereby increasing the accuracy and bandwidth of hall effect sensor circuitry.

An ideal hall effect sensor has uniform gain. However, practically, the gain of the hall effect sensor can change due to various factors. For example, the Earth's stray magnetic field, changes in time, temperature, etc., can affect the gain of the hall effect sensor. If the gain of the hall effect sensor changes, the output signal of the hall effect sensor may be inaccurate. Accordingly, examples described herein track changes in the gain of the hall effect sensor circuitry. In this manner, examples described herein can adjust the gain of the hall effect sensor by adjusting the bias current to compensate for the change in the gain, thereby increasing the accuracy of hall effect sensor circuitry.

Figure 1B:
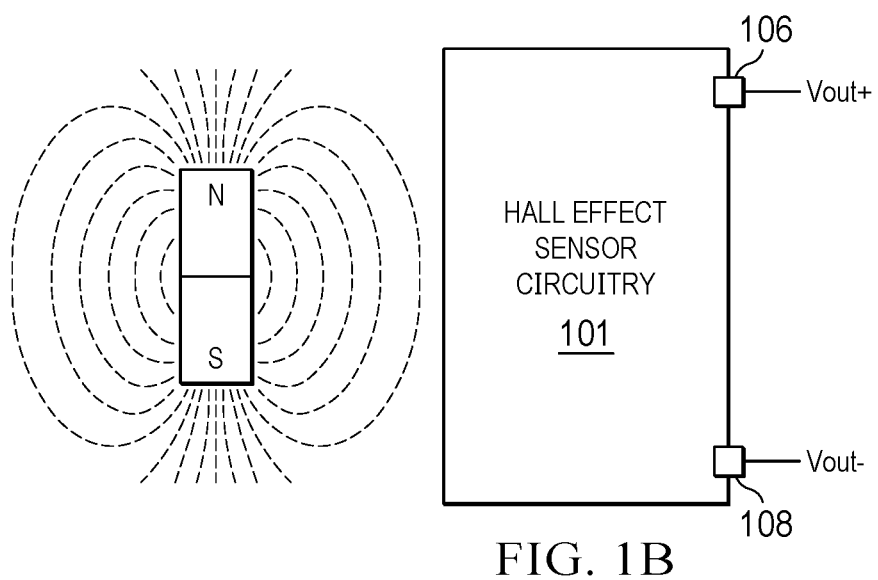

FIGS. 1A and 1B illustrates example hall effect sensor circuitry 100, 101. The example hall effect sensor circuitry 100 of FIG. 1A includes an example input terminal 102 and example output terminals 104, 106, 108. The example hall effect sensor circuitry 101 of FIG. 1B includes the example output terminals 106, 108 of FIG. 1A.

The hall effect sensor circuitry 100 of FIG. 1A is a circuit to measure an amount of current drawn by a circuit. The current from a circuit is provided to the input terminal 102 and output via the output terminal 104 to allow the current drawn by the circuit to flow from the input terminal 102 to the output terminal 104. As described above, the flow of current generates a magnetic field that hall effect sensors in the hall effect sensor circuitry 100 sense to generate an output voltage that is representative of the amount of current through the terminals 102, 104. In the example of FIG. 1A, the output voltage (also referred to as output signal) is a differential output voltage output provided at the output terminals 106, 108. However, the hall effect sensor circuitry 100 may have a single output terminal (e.g., terminal 106) to output a single voltage that represents the current, as further described below in conjunction with FIGS. 4 and 5. As further described below, the hall effect sensor circuitry 100 can sense current across a wide bandwidth and mitigate an offset of the hall effect sensors, flicker, and/or changes in gain.

The hall effect sensor circuitry 101 of FIG. 1B is a circuit to measure a magnetic field. The hall effect sensor circuitry 101 of FIG. 1B includes all of the same circuitry as the hall effect sensor circuitry 100 of FIG. 1A. However, because the hall effect circuitry 101 is not measuring a current, the terminals 102, 104 are removed and the hall effect sensors in the hall effect sensor circuitry 100 measure the magnetic field without passing current near the hall effect sensors. Although examples describe the hall effect sensor circuitry to measure a current in conjunction with the hall effect sensor circuitry 100 of FIG. 1A, some described examples can be utilized in conjunction with the hall effect sensor circuitry 101 of FIG. 1B.

Figure 2:
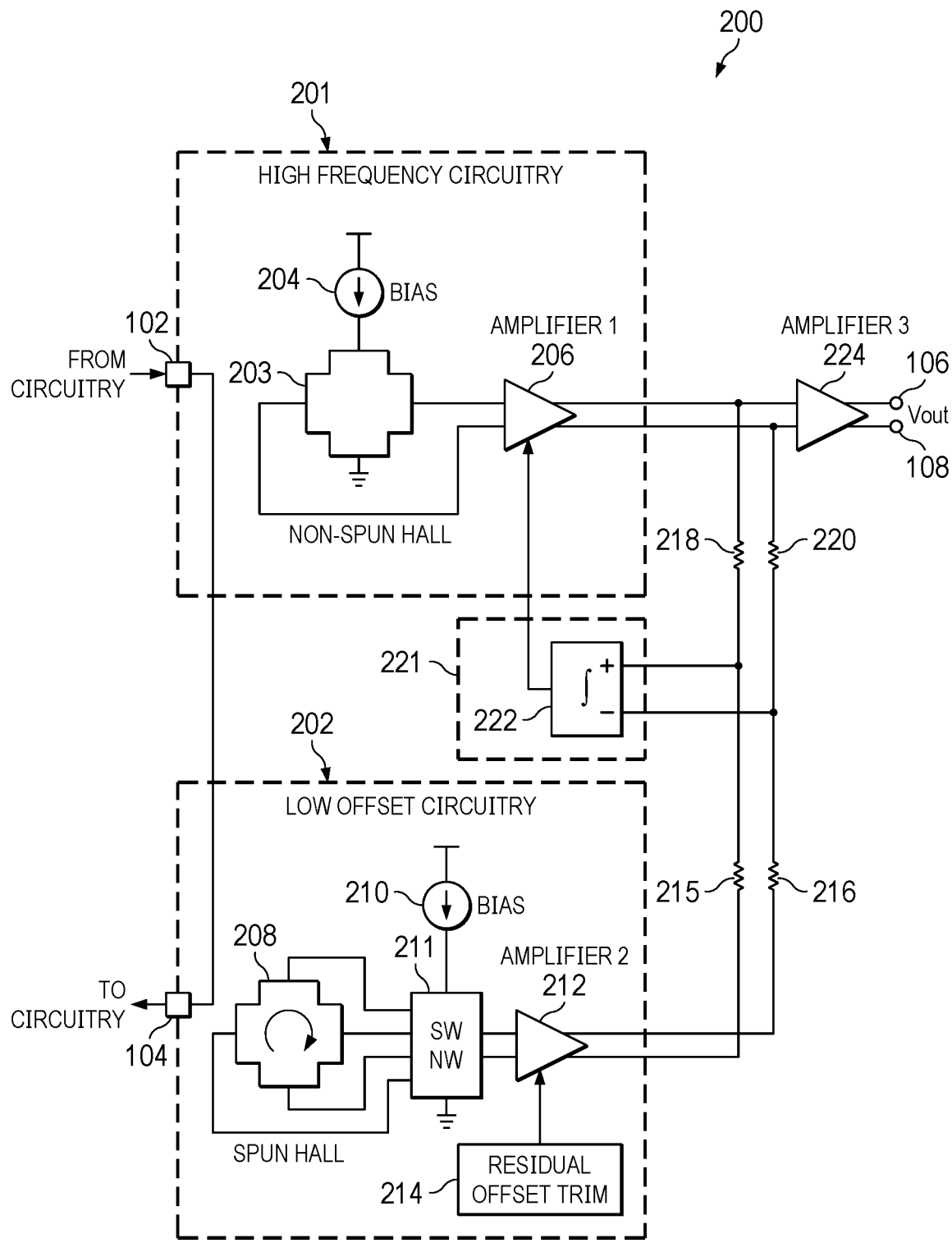
FIG. 2 is a circuitry diagram of the example hall effect sensor circuitry of FIG. 1A with offset compensation.

FIG. 2 illustrates example hall effect sensor circuitry 200 that may be used to implement the example hall effect sensor circuitry 100 of FIG. 1A. The example hall effect circuitry 200 includes example high frequency circuitry 201 and example low offset circuitry 202. The high frequency circuitry 201 includes an example hall effect sensor 203, an example bias current source 204, an example amplifier 206, and the example terminal 102 of FIG. 1A. The example low offset circuitry 202 includes an example hall effect sensor 208, an example bias current source 210, an example switch (SW) network (NW) 211, an example amplifier 212, and example residual offset trim circuitry 214. The hall effect sensor circuitry 200 further includes example resistors 215, 216, 218, 220, offset reduction circuitry 221, integrator circuitry 222, an example output amplifier 224, and the example terminals 106, 108 of FIG. 1A. Although the example hall effect sensor circuitry 200 is described in conjunction with the hall effect sensor circuitry 100 of FIG. 1A, hall effect sensor circuitry 200 may be described in conjunction with the hall effect sensor circuitry 101 of FIG. 1B. For example, the terminals 102, 104 and the connection between the terminals 102, 104 may be removed to implement the hall effect sensor circuitry 101 of FIG. 1B.

The example hall effect sensor 203 of FIG. 2 is a four terminal hall effect sensor. The hall effect sensor 203 is capable of sensing a magnetic field generated by the current that flows from the first terminal 102 to the second terminal 104. The hall effect sensor 203 has four terminals. However, the hall effect sensor 203 may have a different number of terminals. The hall effect sensor 203 has a first terminal coupled to the bias current source 204, a second terminal coupled to ground (e.g., via a ground terminal), a third terminal coupled to a first input terminal of the amplifier 206, and a fourth terminal coupled to a second input terminal of the amplifier 206. Responsive to the bias current source 204 applying the bias current to the first terminal of the hall effect sensor 203, the bias current flows to ground via the second terminal of the hall effect sensor 203.

If there is no magnetic field (e.g., the current through the terminals 102, 104 is zero) or the magnetic field is substantially small, the effect on the flow of the bias current may be minimal or zero. Also, the voltage differential between the third and fourth terminals of the hall effect sensor 203 is zero if there is no magnetic field (e.g., the current through the terminals 102, 104 is zero) or the magnetic field is substantially small. However, the higher the current flowing from the first terminal 102 to the second terminal 104, the higher the magnetic field near the hall effect sensor 203. The higher the magnetic field, the larger the effect on the bias current, thereby creating a larger voltage differential between the third and fourth terminals of the hall effect sensor 203.

A spinning technique is not performed on the hall effect sensor 203 (e.g., the bias current is applied to the same terminal throughout operation). Thus, there is no need for a low pass filter to filter out high frequency noise caused by the spinning technique. Thus, the hall effect sensor 203 is able to operate across a wide bandwidth (e.g., from DC to a high frequency (e.g., 1 Giga Hertz)). However, as described above, the output signal of the hall effect sensor 203 may include an offset due to temperature and/or the manufacturing process of the hall effect sensor 203.

The bias current source 204 of FIG. 2 is circuitry that generates a bias current that is applied to the hall effect sensor 203. The bias current source 204 has a first terminal coupled to a supply voltage terminal that receives a supply voltage and a second terminal coupled to the first terminal of the hall effect sensor 203. As further described below in conjunction with FIGS. 4 and/or 5, the bias current source 204 can adjust the amount of bias current to compensate for changes in gain in the hall effect sensor 203.

The amplifier 206 of FIG. 2 is a fully differential amplifier that amplifies the voltage differential generated by the hall effect sensor 203 by some gain. The amplifier 206 has three input terminals and two output terminals. However, in some examples, the amplifier 206 may have three input terminals and one output terminal (e.g., a differential amplifier), as further described below in conjunction with FIGS. 4-5. The first input terminal of the amplifier 206 is coupled to the third terminal of hall effect sensor 203. The second input terminal of the amplifier 206 is coupled to the fourth terminal of the hall effect sensor 203. The third input terminal of the amplifier 206 is coupled to an output terminal of the offset reduction circuitry 221. The first output terminal (e.g., the non-inverting terminal) is coupled to the resistor 218 and the first input terminal of the output amplifier 224. The second output terminal (e.g., the inverting terminal) is coupled to the resistor 220 and the second input terminal of the output amplifier 224.

The amplifier 206 amplifies the voltage differential between the first two input terminals (e.g., the voltage differential generated by the hall effect sensor 203) by a gain. The input offset (also referred to as input offset voltage) of the amplifier 206 can be adjusted based on the output signal from the offset reduction circuitry 211 to eliminate and/or otherwise reduce the offset of the hall effect sensor 203, as further described below. The amplifier 206 provides a first voltage corresponding to a product of the voltage differential and the gain at the non-inverting output terminal. Also, the amplifier 206 provides a second voltage, opposite (e.g., inverted from) the first voltage, at the inverting output terminal.

The example hall effect sensor 208 of FIG. 2 is a four terminal hall effect sensor capable of sensing a magnetic field generated by the current that flows from the first terminal 102 to the second terminal 104. The hall effect sensor 208 has four terminals. However, the hall effect sensor 208 may have a different number of terminals. The four terminals of the hall effect sensor 208 are coupled to the switch network 211. The hall effect sensor 208 has the same characteristics as the hall effect sensor 203. However, a current spinning technique and/or protocol (e.g., also referred to as a spinning protocol, a spinning modulation protocol, a current spinning modulation protocol, etc.) is utilized by the switch network 211 to adjust which terminal the bias current from the bias current source 210 is applied to. As such, the hall effect sensor 208 is referred to as a "spun" hall effect sensor or "spun" hall. Whereas, the hall effect sensor 203 is referred to as a "non-spun" hall effect sensor or "non-spun" hall.

For example, during a first phase, the switch network 211 is configured so that the first terminal is coupled to the bias current source 210, the second terminal is coupled to ground (e.g., a ground terminal), the third terminal is coupled to a first input terminal of the amplifier 212, and the fourth terminal is coupled to a second input terminal of the amplifier 212. During a second phase, the switch network 211 is configured so that the second terminal is coupled to the bias current source 210, the third terminal is coupled to ground (e.g., a ground terminal), the fourth terminal is coupled to a first input terminal of the amplifier 212, and the first terminal is coupled to a second input terminal of the amplifier 212. During a third phase, the switch network 211 is configured so that the third terminal is coupled to the bias current source 210, the fourth terminal is coupled to ground (e.g., a ground terminal), the first terminal is coupled to a first input terminal of the amplifier 212, and the second terminal is coupled to a second input terminal of the amplifier 212. During a fourth phase, the switch network 211 is configured so that the fourth terminal is coupled to the bias current source 210, the first terminal is coupled to ground (e.g., a ground terminal), the second terminal is coupled to a first input terminal of the amplifier 212, and the third terminal is coupled to a second input terminal of the amplifier 212. Each phase results in a different offset, where the offset from the first and third phases are opposites, and the offset of the second and fourth phases are opposites. As further described below, the switch network 211 adds the signal produced during the four phases to cancel or otherwise reduce the offset of the hall sensor 208.

The bias current source 210 of FIG. 2 is circuitry that generates a bias current that is applied to the hall effect sensor 208. The bias current source 210 has a first terminal coupled to a supply voltage terminal that receives a supply voltage and a second terminal coupled to the first terminal of the hall effect sensor 208. As further described below in conjunction with FIGS. 4A, 4B, and/or 5, the bias current source 210 can adjust the amount of bias current to compensate for changes in gain in the hall effect sensor 208.

The example switch network 211 of FIG. 2 facilitates the spinning protocol of the hall effect sensor 208. The switch network 211 has five input terminals and three output terminals. The first input terminal of the switch network 211 is coupled to the first terminal of the hall effect sensor 208. The second input terminal of the switch network 211 is coupled to the second terminal of the hall effect sensor 208. The third input terminal of the switch network 211 is coupled to the third terminal of the hall effect sensor 208. The fourth input terminal of the switch network 211 is coupled to the fourth terminal of the hall effect sensor 208. The fifth input terminal of the switch network 211 is coupled to the bias current source 210. The first output terminal of the switch network 211 is coupled to ground (e.g., a ground terminal). The second output terminal of the switch network 211 is coupled to the first input terminal of the amplifier 212. The third output terminal of the switch network 211 is coupled to the second input terminal of the amplifier 212. The switch network 211 includes a network of switches that can open or close to rotate couplings to the terminals of the hall effect sensor 208 during a spinning protocol. The switch network 211 may include a controller, timing circuitry, a state machine, etc., to control the timing of the spinning protocol and the opening (e.g., non-conducting) and closing (e.g., conducting) of the switches. Also, the switch network 211 may include adder circuitry to add the signals output by the hall sensor (e.g., the voltage differential corresponding to the magnetic field) during the four phases of the spinning protocol to remove and/or otherwise reduce the offset of the hall effect sensor 208. The example switch network 211 provides the sum of the voltage differential measured by the hall effect sensor to the amplifier 212.

The amplifier 212 of FIG. 2 is a fully differential amplifier that amplifies the voltage differential generated by the hall effect sensor 208 by some gain. The amplifier 212 has three input terminals and two output terminals. However, in some examples, the amplifier 212 may have three input terminals and one output terminal (e.g., a differential amplifier), as further described below in conjunction with FIGS. 4-5. The first input terminal of the amplifier 212 is coupled to the second output terminal of the switch network 211. The second input terminal of the amplifier 212 is coupled to the third output terminal of the switch network 211. The third input terminal of the amplifier 212 is coupled to an output terminal of the residual offset trim circuitry 214. The first output terminal (e.g., the non-inverting terminal) is coupled to the resistor 215. The second output terminal (e.g., the inverting terminal) is coupled to the resistor 216.

The amplifier 212 amplifies the voltage differential between the first two input terminals (e.g., the voltage differential generated by the hall effect sensor 208) by a gain. The input offset of the amplifier 212 is adjusted based on the output signal from the residual offset trim circuitry 214 to eliminate and/or otherwise reduce the offset of the hall effect sensor 208, as further described below. The amplifier 212 provides a first voltage corresponding to a product of the voltage differential and the gain at the non-inverting output terminal. Also, the amplifier 212 provides a second voltage, opposite (e.g., inverted from) the first voltage, at the inverting output terminal. In an example, the gain of the amplifier 212 is the same or similar to the gain of the amplifier 206.

The residual offset trim circuitry 214 of FIG. 2 adjusts the input offset of the amplifier 212 to compensate for residual offset after hall current spinning occurs. The residual offset trim circuitry 214 has one output terminal. The output terminal of the residual offset trim circuitry 214 is coupled to the third input terminal of the amplifier 212. Due to Hall current spinning imperfection, the spun hall effect sensor 208 has a residual offset after the spinning protocol occurs. The residual offset can transfer to the output signal of the high-frequency circuitry 201 based on the offset. Thus, the residual offset trim circuitry 214 transfers the same residual offset magnitude in an opposite polarity to the amplifier 212, thereby achieving zero output offset at the output terminal of the hall effect sensor circuitry 200. In some examples, the residual offset trim circuitry 214 is synchronously clocked with the hall current spinning phases.

The example resistors 215, 216, 218, 220 of FIG. 2 each have two terminals. The first terminal of the resistor 215 is coupled to the second output terminal (e.g., the inverting terminal) of the of the amplifier 212. The second terminal of the resistor 215 is coupled to the first input terminal of offset reduction circuitry 221 and the second terminal of the resistor 218. The first terminal of the resistor 216 is coupled to the first output terminal (e.g., the non-inverting terminal) of the of the amplifier 212. The second terminal of the resistor 216 is coupled to the second input terminal of offset reduction circuitry 221 and the second terminal of the resistor 220. The first terminal of the resistor 218 is coupled to the first output terminal (e.g., the non-inverting terminal) of the amplifier 206 and the first input terminal of the output amplifier 224. The second terminal of the resistor 218 is coupled to the first terminal of the offset reduction circuitry 221 and the second terminal of the resistor 215. The first terminal of the resistor 220 is coupled to the second output terminal (e.g., the inverting terminal) of the amplifier 206 and the second input terminal of the output amplifier 224. The second terminal of the resistor 220 is coupled to the second terminal of the offset reduction circuitry 221 and the second terminal of the resistor 216.

The offset reduction circuitry 221 of FIG. 2 determines the offset of the hall effect sensor 203 based on the output signal of the first amplifier 206 and the output signal of the second amplifier 212. In FIG. 2, the offset reduction circuitry 221 is implemented by an integrator circuitry 222. Thus, the terminals of the offset reduction circuitry 221 correspond to or are the same as the terminals of the integrator circuitry 222. The integrator circuitry 222 has a first input terminal, a second input terminal, and an output terminal. The first input terminal of the integrator circuitry 222 is coupled to the second terminal of the resistor 218 and the second terminal of the resistor 215. The second input terminal of the integrator circuitry 222 is coupled to the second terminal of the resistor 220 and the second terminal of the resistor 216. The output terminal of the integrator circuitry 222 is coupled the third input terminal of the amplifier 206.

The offset reduction circuitry 221 generates a signal (e.g., an offset reduction signal) corresponding to the offset of the hall effect sensor 203 based on the first amplified output signal from the hall effect sensor 203 and the second amplified output signal from the hall effect sensor 208. For example, because the hall effect sensors 203, 208 have the same or similar characteristics, the only difference between the first amplified output signal and the second amplified output signal is that the second amplified output signal may not have an offset due to the spinning technique in which the first amplified output signal may have an offset. Accordingly, the offset reduction circuitry 221 compares the output signal of the amplifier 206 to the output signal of the amplifier 212 to generate a signal that corresponds to the offset of the hall effect sensor 203. The offset reduction signal is an analog signal that is applied to an input terminal of the amplifier 206. The offset reduction signal corresponds to the amount of offset generated by the non-spun hall effect sensor(s) 203. In the example of FIG. 2, the offset reduction circuitry 221 uses an integrator to integrate the output signal from the amplifier 206 and the output signal from the amplifier 212 with respect to time to generate the offset signal in the analog domain. However, as further described below in conjunction with FIG. 3, the offset reduction circuitry 221 can be implemented with different circuitry to generate the offset signal (e.g., in the digital domain). As described above, the offset signal is used to adjust the output signal of the amplifier 206 to reduce and/or eliminate the offset from the sensor 203 without requiring spinning of the sensor 203. Thus, the amplifier 206, after a threshold amount of time for the circuit to settle, provides an offset reduced and/or offset free output signal over a wideband range of frequencies without using a filter to remove high frequency noise due to a spinning protocol.

The amplifier 224 of FIG. 2 is a fully differential amplifier that amplifies the voltage differential generated by the amplifier 206 by some gain. The amplifier 224 has two input terminals and two output terminals. However, in some examples, the amplifier 224 may have two input terminals and one output terminal (e.g., a differential amplifier), as further described below in conjunction with FIGS. 4A-5. The first input terminal of the amplifier 224 is coupled to the first output terminal of the amplifier 206 and the resistor 218.

The second input terminal of the amplifier 224 is coupled to the second output terminal of the amplifier 206 and the resistor 220. The first output terminal (e.g., the non-inverting terminal) of the amplifier 224 is coupled to the non-inverting output terminal 106 of FIG. 1A. The second output terminal (e.g., the inverting terminal) is coupled to the inverting output terminal 108 of FIG. 1A. The amplifier 224 amplifies the voltage differential between the first two input terminals (e.g., the voltage differential generated by the amplifier 206) by a gain. The amplifier 224 provides a first voltage corresponding to a product of the voltage differential and the gain at the non-inverting output terminal. Also, the amplifier 224 provides a second voltage, opposite (e.g., inverted from) the first voltage, at the inverting output terminal.

Figure 3:
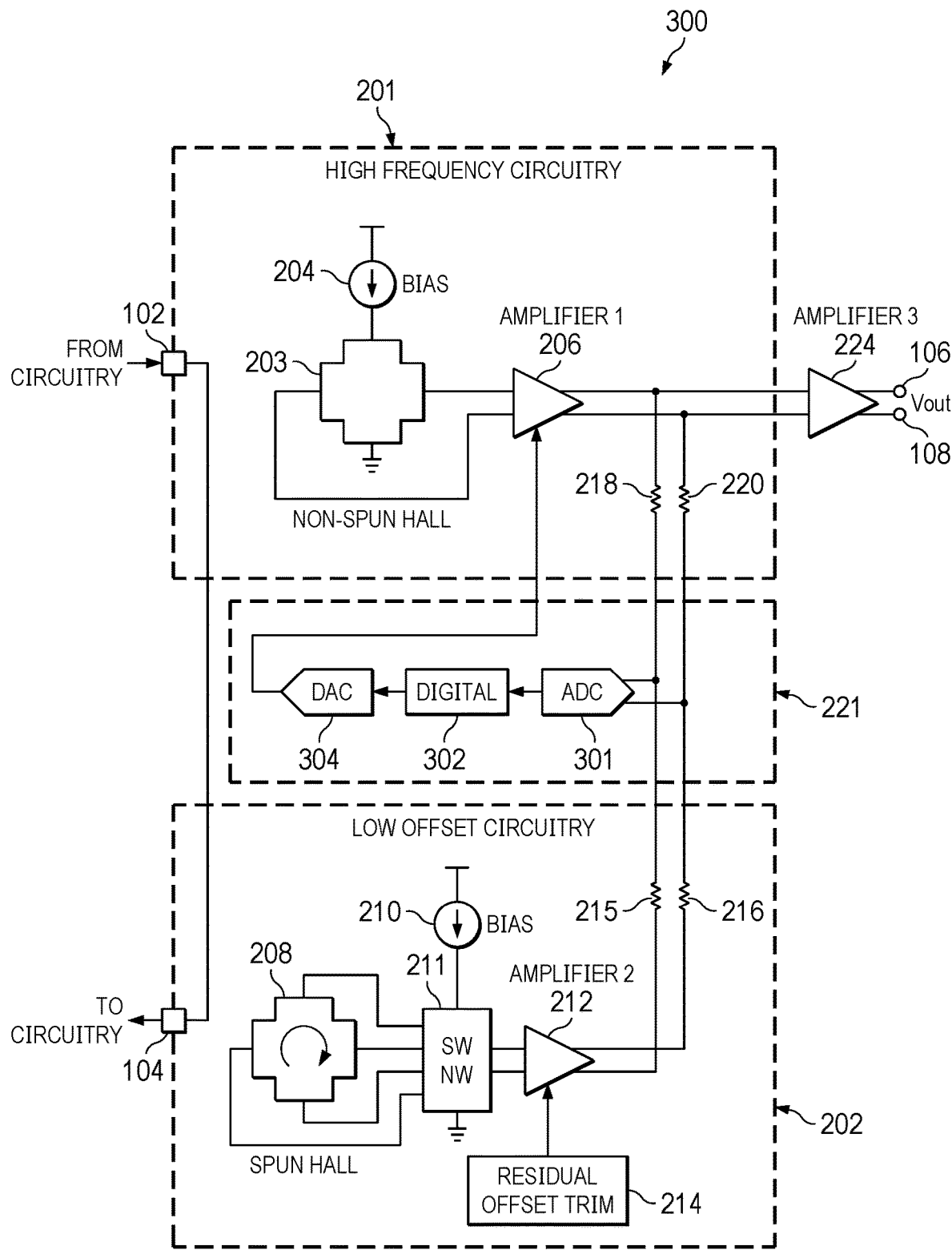
FIG. 3 is an alternative circuitry diagram of the example hall effect sensor circuitry of FIG. 1A with offset compensation.

FIG. 3 illustrates alternative example hall effect sensor circuitry 300 that may be used to implement the example hall effect sensor circuitry 100 of FIG. 1A. The hall effect sensor circuitry 300 of FIG. 3 has the terminals 102, 104, 106, 108 of FIG. 1A. The hall effect sensor circuitry 300 further includes the high frequency circuitry 201, the low offset circuitry 202, the hall effect sensors 203, 208, the bias current sources 204, 210, the amplifiers 206, 212, 224, the switch network 211, the residual offset trim circuitry 214, the resistors 215, 216, 218, 220, and the offset reduction circuitry 221 of FIG. 2. In FIG. 3 the offset reduction circuitry 221 is implemented by an example analog-to-digital converter (ADC) 301, example digital circuitry 302, and an example digital-to-analog converter (DAC) 304.

In FIG. 3, the offset reduction circuitry 221 converts the output signals of the amplifiers 206, 212 into the digital domain and processes the output signals in the digital domain. For example, the ADC 301 (e.g., a multichannel ADC or implemented by multiple ADCs) converts the analog signals from the amplifiers 206, 212 into digital signals (e.g., a direct current (DC) voltage corresponding to an analog signal). The ADC 301 has a first input terminal, a second input terminal, and an output terminal. The first input terminal of the ADC 301 is coupled to the resistors 215, 218. The second input terminal of the ADC 301 is coupled to the resistors 216, 220. The output terminal of the ADC 301 is coupled to the input terminal of the digital circuitry 302. The output signal of the amplifiers 206, 212 are shorted together via the resistors 215, 216, 218, 220. The ADC 301 converts the output signal of the first amplifier 206 and the output signal of the second amplifier 212 at the same point(s) in time. The ADC 301 provides the signal samples corresponding to the first amplifier 206 and/or the second amplifier 212 across time to the digital circuitry 302.

The digital circuitry 302 of FIG. 3 determines a digital offset signal that corresponds to the amount of offset of the hall sensor 203 based on the obtained digital samples. The digital circuitry 302 has an input terminal and an output terminal. The input terminal of the digital circuitry 302 is coupled to the output terminal of the ADC 301. The output terminal of the digital circuitry 302 is coupled to an input terminal of the DAC 304. The digital circuitry 302 may include storage (e.g., memory, a look-up table, a database, etc.) that includes known output signal patterns that correspond to different offsets of the hall effect sensor 203. In this manner, the digital circuitry 302 can compare the digital signal(s) from the ADC 301 (e.g., corresponding to the output signals of the amplifier 206 and the amplifier 212) to known patterns to generate a digital offset signal corresponding to the offset of the hall effect sensor 203. The digital circuitry 302 provides the digital offset signal to the example DAC 304.

The DAC 304 of FIG. 3 converts the digital offset signal to an analog offset signal. The DAC 304 has an input terminal and a output terminal. The input terminal of the DAC 304 is coupled to the output terminal of the digital circuitry 302. The output terminal of the DAC 304 is coupled to the third input terminal of the amplifier 206. The DAC 304 generates the analog offset signal corresponding to the offset of the hall effect sensor 203 to reduce, eliminate, and/or compensate for the offset of the hall effect sensor 203. For example, the input offset of the amplifier 206 is adjusted based on the output signal from the offset reduction circuitry 211 to reduce the effect of the offset of the hall effect sensor 203.

Figure 4A:
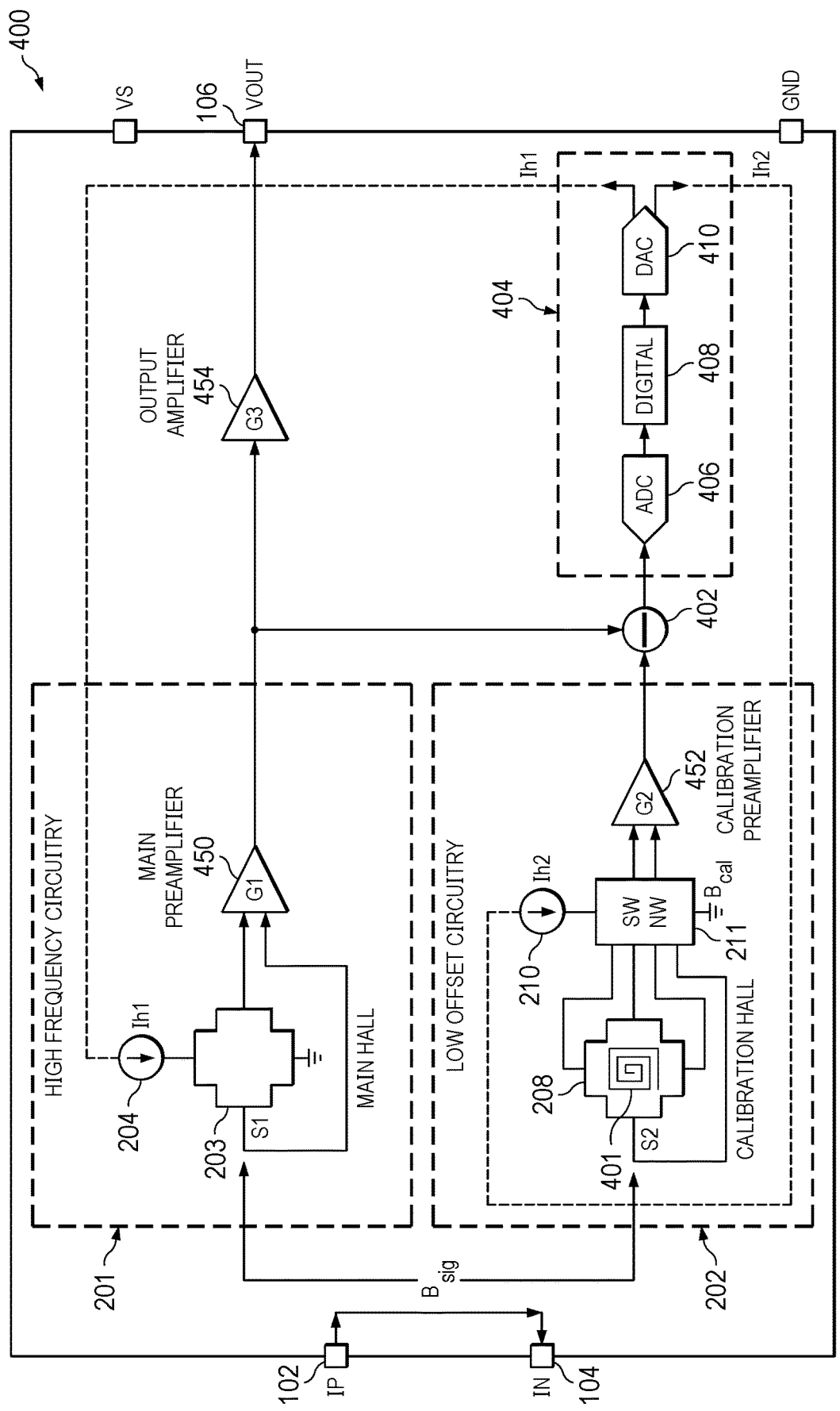
FIG. 4A is a circuitry diagram of the example hall effect sensor circuitry of FIG. 1A with gain calibration.

FIG. 4A illustrates alternative example hall effect sensor circuitry 400 that may be used to implement the example hall effect sensor circuitry 100 of FIG. 1A, to continuously calibrate for changes in gain of the hall effect sensors 203, 208. The hall effect sensor circuitry 400 of FIG. 4A has the terminals 102, 104, 106, 108 of FIG. 1A. The hall effect sensor circuitry 400 further includes the high frequency circuitry 201, the low offset circuitry 202, the hall effect sensors 203, 208, the bias current sources 204, 210, the switch network 211, and the residual offset trim circuitry 214 of FIG. 2. The hall effect sensor circuitry 400 further includes an example coil 401, example subtractor circuitry 402, example gain calibration circuitry 404, an example ADC 406, example digital circuitry 408, example DAC 410, and example amplifiers 450, 452, 454. In the example hall effect sensor circuitry 400, the amplifiers 450, 452, 454 are differential amplifiers. However, the hall effect sensor circuitry 400 could be implemented using the fully differential amplifiers 206, 212, 224 of FIGS. 2 and/or 3 and/or with the resistors 215, 216, 218, 220.

As described above, the gain of the hall effect sensors 203, 208 may change due to aging, mechanical stress, and temperature, etc. The more the gain changes, the less accurate the hall effect sensor circuitry is in determining an amount of current. Changes in gain can be calibrated by adjusting the bias current used in the hall sensors 203, 208. However, in order to compensate for changes in gain, the amount of gain change needs to be determined. Accordingly, in FIG. 4A the hall effect sensor circuitry 400 includes the coil 401, the subtractor circuitry 402, and the gain calibration circuitry 404 to determine an amount of gain change and adjust the bias current based on the amount of gain change. The gain calibration process may be periodic or continuous in time.

As illustrated in the hall effect sensor circuitry 400 of FIG. 4A, the example coil 401 is located near the hall effect sensor 208 and not located near the hall effect sensor 203. The coil 401 has a first terminal and second terminal. The first terminal can be coupled to ground and the second terminal can be coupled to a voltage and/or current source. Responsive to a voltage and/or current being applied to the coil 401, the coil generates a magnetic field that is amplified by the hall effect sensor 208 and the amplifier 452. Thus, the output signal of the amplifier 452 includes a higher or lower voltage than the amplifier 450 due to the amplified signal caused by the coil 401. If the gain of the hall effect sensor 208 increases, the output signal of the amplifier 452 also increases because the hall effect sensor 208 increases the signal from the coil 401 with the increased gain. Also, because there is no coil near the hall effect sensor 203, the output signal of the amplifier 450 does not include an amplified coil signal.

The example subtractor circuitry 402 of FIG. 4A subtracts the output signal of the amplifier 450 from the output signal of the amplifier 452. The subtractor circuitry 402 has a first input terminal, a second input terminal, and an output terminal. The first input terminal of the subtractor circuitry 402 is coupled to the output terminal of the amplifier 452. The second input terminal is coupled to the output signal of the amplifier 450 and the input of the output amplifier 454. The output of the subtractor circuitry 402 is coupled to the input terminal of the gain calibration circuitry 404. Because the signal from the hall sensor 208 amplifies the coil signal caused by the coil 401, which reflects changes in gain, the output signal of the amplifier 452 further amplifies the coil signal. Thus, by subtracting the output signal of the amplifier 450 from the output signal of the amplifier 452, the result is a coil signal representative of the gain. For example, the subtractor circuitry 402 cancels the output signal that is common to the output signals of the amplifiers 450, 452 to recover the coil signal. The subtractor circuitry 402 provides the coil signal to the example gain calibration circuitry 404.

The gain calibration circuitry 404 of FIG. 4A includes the ADC 406, the digital circuitry 408, and the DAC 410. The ADC 406 has an input terminal and an output terminal. The input terminal of the ADC 406 is coupled to the output terminal of the subtractor circuitry 402. The output terminal of the ADC 406 is coupled to the input terminal of the digital circuitry 408. The ADC 406 converts the analog coil signal corresponding to the gain of the hall effect sensors 203, 208 into one or more digital values (e.g., at one or more points in time).

The digital circuitry 408 of FIG. 4A determines an amount of bias current to apply to the hall effect sensors 203, 208 based on the digital value(s) corresponding to the coil signal. The digital circuitry 408 has an input terminal and an output terminal. The input terminal is coupled to the output terminal of the ADC 406. The output terminal of the digital circuitry 408 is coupled to an input terminal of the DAC 410. The digital circuitry 408 determines an amount of bias current to apply to the hall sensors 203, 208 based on the obtained digital coil signal value(s) to compensate for the gain and/or a change in gain of the hall effect sensors 203, 208. In some examples, the digital circuitry 408 includes storage (e.g., memory, database, a look-up-table, etc.) that associates digital coil signal(s) to bias current values. In this manner, responsive to the digital coil signal(s) obtained, the digital circuitry 408 can identify a corresponding current value based on the matching digital coil signal(s). The digital circuitry 408 may select the same value for the bias currents or different values (e.g., one for the current source 204 and a different one for the current source 210). The digital circuitry 408 provides the value corresponding to the determined amount of bias current to the example DAC 410.

The example DAC 410 of FIG. 4A converts the digital value to a corresponding analog signal. The DAC 410 has an input terminal and two output terminals. The input terminal of the DAC 410 is coupled to the output terminal of the digital circuitry 408. The first output terminal of the DAC 410 is coupled to the current source 204. The second output terminal of the DAC 410 is coupled to the current source 210. In some examples, the DAC 410 may have a single output terminal coupled to both the current sources 204, 210. The DAC 410 provides one or more analog signals to the current sources 204, 210 to control the amount of bias current that is applied to the respective hall effect sensors 203, 208.

In operation, after startup, the gain calibration 404 settles on a bias current to apply to the hall effect sensors 203, 208. If the gain of the hall effect sensors 203, 208 changes (e.g., increases), the change is reflected in the output of the amplifier 452 due to the amplification of the gain via the coil 401 and the amplifier 452. Thus, the output signal of the subtractor circuitry 402 also changes. The gain calibration circuitry 404 adjusts the output value responsive to the change in the output of the subtractor circuitry 402. The adjusted output value changes the amount of bias current applied to the hall effect sensors 203, 208 based on the change in the output signal of the subtractor circuitry 402. Thus, the gain calibration circuitry 404 can determine a change in gain and adjust the bias current of the hall effect sensors 203, 208 to compensate for the change in gain to maintain accuracy of the hall effect sensor circuitry 400. The gain calibration process may be periodic in time or continuous in time.

Figure 4B:
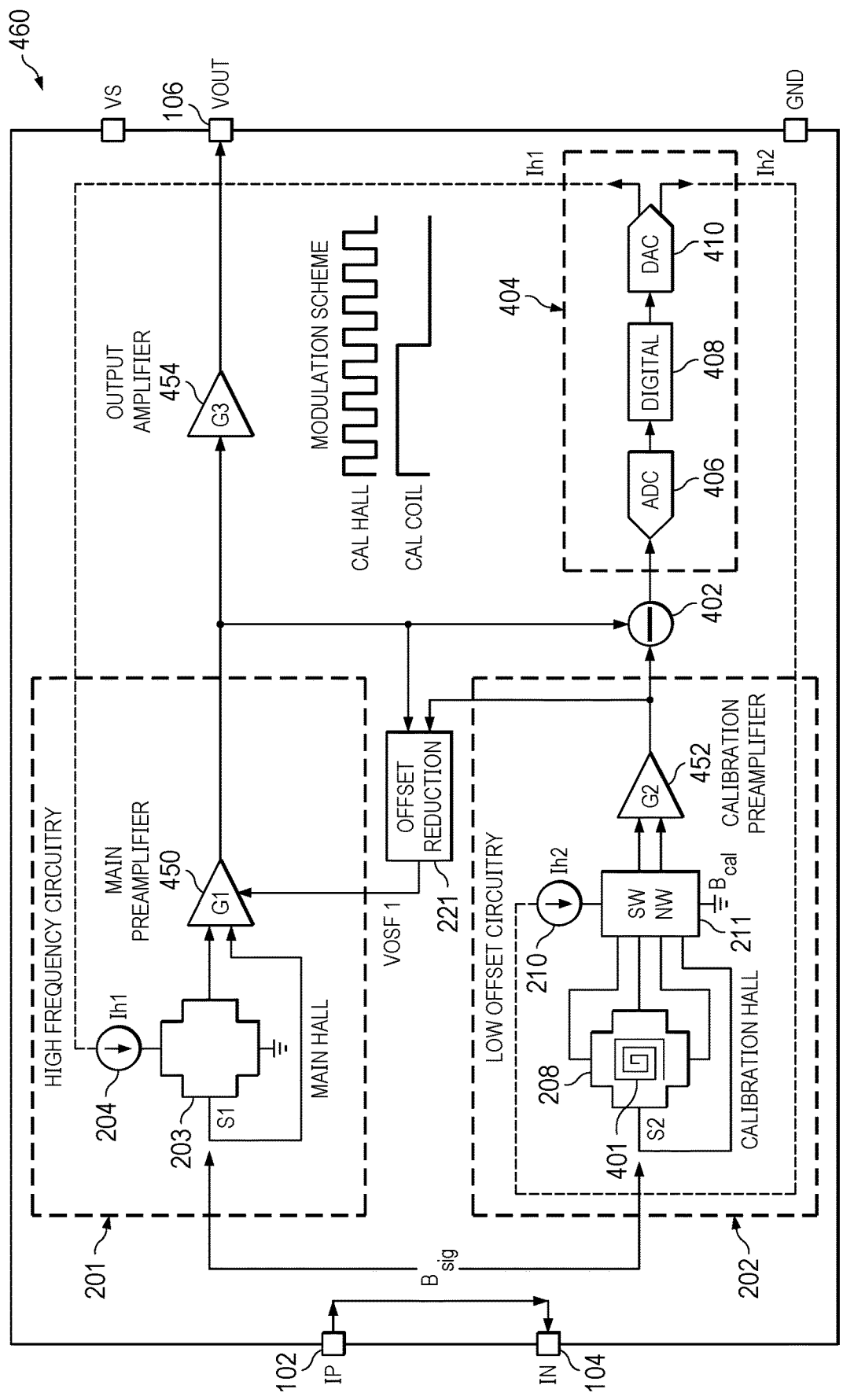
FIG. 4B is a circuitry diagram of the example hall effect sensor circuitry of FIG. 1A with offset compensation and gain calibration.

FIG. 4B illustrates alternative example hall effect sensor circuitry 460 that may be used to implement the example hall effect sensor circuitry 100 of FIG. 1A to compensate for changes in gain of the hall effect sensor 203, 208. The hall effect sensor circuitry 460 of FIG. 4B has the terminals 102, 104, 106, 108 of FIG. 1A. The hall effect sensor circuitry 460 further includes the high frequency circuitry 201, the low offset circuitry 202, the hall effect sensors 203, 208, the bias current sources 204, 210, the switch network 211, the residual offset trim circuitry 214, and the offset reduction circuitry 221 of FIG. 2. The offset reduction circuitry 221 can be implemented using the integrator 222 of FIG. 2 or the ADC 301, digital circuitry 302, and DAC 304 of FIG. 3. The hall effect sensor circuitry 460 further includes an example coil 401, example subtractor circuitry 402, example gain calibration circuitry 404, an example ADC 406, example digital circuitry 408, example DAC 410, and example amplifiers 450, 452, 454. In the example hall effect sensor circuitry 460, the amplifiers 450, 452, 454 are differential amplifiers. However, the hall effect sensor circuitry 460 could be implemented using the fully differential amplifiers 206, 212, 224 of FIGS. 2 and/or 3 and/or with the resistors 215, 216, 218, 220.

The hall effect sensor circuitry 460 of FIG. 4B includes the example offset reduction circuitry 221 of FIGS. 2 and/or 3 to perform offset reduction, as further described above. In the hall effect sensor circuitry 460, the first input terminal of the offset reduction circuitry 221 is coupled to the output terminal of the amplifier 450 and the first input terminal of the subtractor circuitry 402. The second input terminal of the offset reduction circuitry 221 is coupled to the output terminal of the amplifier 452 and the second input terminal of the subtractor circuitry 402. The output terminal of the offset reduction circuitry 221 is coupled to a third input terminal of the amplifier 450.

Consistent with the illustrated modulation scheme, the coil 401 is modulated with the spinning modulation of the hall effect sensor 208 so that the offset reduction circuitry 221 can perform offset reduction without the effect of the coil signal. For example, as described above, the spinning modulation protocol includes four phases for applying the bias current to the four input terminals of the hall effect sensor 208. Because flowing the current in the opposite direction in the hall effect sensor 208 changes the polarity of the offset, the offset reduction circuitry 221 processes the output signal of the hall effect sensor 208 across the four phases to cancel out and/or reduce the offset. However, applying the current to the coil 401 affects the output signal of the hall effect sensor 208 due to the increased magnetic field caused by the coil 401. Thus, the current applied to the coil 401 is reversed after the first four phases for a subsequent four phases. Reversing the current changes the polarity of the magnetic field generated by the coil 401. Thus, the offset reduction circuitry 221 can process the output signal of the hall effect sensor 208 across the eight phases to cancel out and/or reduce the offset and the effect of the coil 401.

Figure 5:
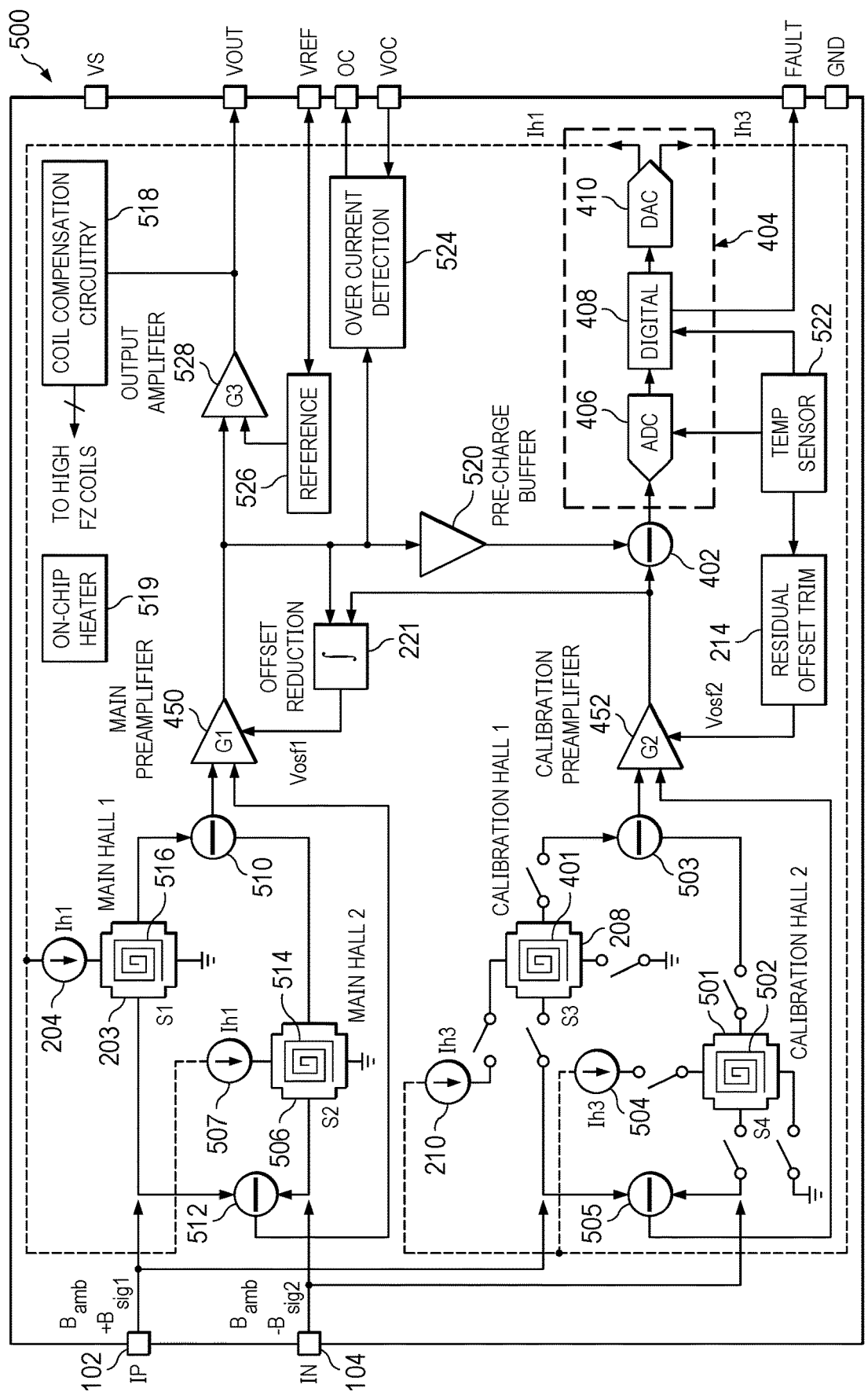
FIG. 5 is an alternative circuitry diagram of the example hall effect sensor circuitry of FIG. 1A with offset compensation and gain calibration.

FIG. 5 illustrates alternative example hall effect sensor circuitry 500 that may be used to implement the example hall effect sensor circuitry 100 of FIG. 1A to compensate for changes in gain of the hall effect sensors 203, 208. The hall effect sensor circuitry 500 of FIG. 5 has the terminals 102, 104, 106, 108 of FIG. 1A. The hall effect sensor circuitry 500 further includes the high frequency circuitry 201, the low offset circuitry 202, the hall effect sensors 203, 208, the bias current sources 204, 210, the switch network 211, the residual offset trim circuitry 214, and the offset reduction circuitry 221 of FIG. 2. The offset reduction circuitry 221 can be implemented using the integrator 222 of FIG. 2 or the ADC 301, digital circuitry 302, and DAC 304 of FIG. 3. The hall effect sensor circuitry 500 further includes the example coil 401, the example subtractor circuitry 402, the example gain calibration circuitry 404, the example ADC 406, the example digital circuitry 408, example DAC 410, and the example amplifiers 450, 452 of FIGS. 4A and/or 4B. In the example hall effect sensor circuitry 500, the amplifiers 450, 452 are differential amplifiers. However, the hall effect sensor circuitry 500 could be implemented using the fully differential amplifiers 206, 212, 224 of FIGS. 2 and/or 3 and/or with the resistors 215, 216, 218, 220. The example hall effect sensor circuitry 500 further includes example hall effect sensors 501, 506, example coils 502, 514, 516, example subtractor circuitry 503, 505, 510, 512, example bias current sources 504, 507, example coil compensation circuitry 518, an example pre-charge buffer 520, example temperature sensor 522, example over current detection circuitry 524, an example reference circuitry 526, and an example output amplifier 528.

The example hall effect sensor circuitry 500 of FIG. 5 includes two hall effect sensors 203, 506 for the high frequency circuitry and two hall effect sensors 208, 501 for the low offset circuitry. However, any number of hall effect sensors could be implemented in the high frequency circuitry and/or the low offset circuitry. The second set of hall effect sensors 501, 506 can be implemented to remove and/or reduce the effect of the Earth's stray magnetic field by subtracting the signals of the corresponding output signals using the example subtractor circuitries 503, 505, 510, 512 before being received into the corresponding amplifiers 450, 452.

In FIG. 5, the switches coupled to the terminal of the hall effect sensors 208, 511 represent the switch network 211 of FIG. 1. However, the actual implementation of the switch network 211 may be different than described above in conjunction with FIG. 2. The hall effect sensor 501 has four terminals that are coupled to the bias current source 504, the subtractor circuitry 505, the subtractor circuitry 503, and ground via a switch network (e.g., the switch network 211 of FIG. 2). The coil 502 operates in a similar manner to the coil 401 (e.g., to generate a magnetic field for identifying a change in gain).

The subtractor circuitry 503 generates a difference based on the voltage at corresponding terminals of the hall effect sensors 208, 501. The subtractor circuitry 503 has two input terminals and an output terminal. The first input terminal of the subtractor circuitry 503 is coupled to the hall effect sensor 208 via a switch network. The second input terminal of the subtractor circuitry 503 is coupled to the hall effect sensor 501 via a switch network. The output terminal of the subtractor circuitry 503 is coupled to the first input terminal of the amplifier 452.

The bias current source 504 operates in a similar manner as the bias current source 210 (e.g., to provide a bias current to the hall effect sensor 501). The bias current source 504 has two terminals. The first terminal of the bias current source 504 is coupled to the current source 210 and the output signal of the gain calibration circuitry 404. The second terminal of the bias current source 504 is coupled to the hall effect sensor 501 via a switch network.

The subtractor circuitry 505 generates a difference based on the voltage at corresponding terminals of the hall effect sensors 208, 501. The subtractor circuitry 505 has two input terminals and an output terminal. The first input terminal of the subtractor circuitry 505 is coupled to the hall effect sensor 208 via a switch network. The second input terminal of the subtractor circuitry 505 is coupled to the hall effect sensor 501 via a switch network. The output terminal of the subtractor circuitry 505 is coupled to the second input terminal of the amplifier 452.

The hall effect sensor 506 has four terminals. The first terminal of the hall effect sensor 506 is coupled to the bias current source 507. The second terminal of the hall effect sensor 506 is coupled to ground. The third terminal of the hall effect sensor 506 is coupled to the second input terminal of the subtractor circuitry 510. The fourth terminal of the hall effect sensor 506 is coupled to the second input terminal of the subtractor circuitry 512.

The bias current source 507 operates in a similar manner as the bias current source 204 (e.g., to provide a bias current to the hall effect sensor 506). The bias current source 507 has two terminals. The first terminal of the bias current source 507 is coupled to the current source 204 and the output signal of the gain calibration circuitry 404. The second terminal of the bias current source 507 is coupled to the first terminal of the hall effect sensor 506.

The subtractor circuitry 510 generates a difference based on the voltage at the third terminals of the hall effect sensors 203, 506. The subtractor circuitry 510 has two input terminals and an output terminal. The first input terminal of the subtractor circuitry 510 is coupled to the third terminal of the hall effect sensor 203. The second input terminal of the subtractor circuitry 510 is coupled to the third terminal of the hall effect sensor 506. The output terminal of the subtractor circuitry 510 is coupled to the first input terminal of the amplifier 450.

The subtractor circuitry 512 generates a difference based on the voltage at the fourth terminals of the hall effect sensors 203, 506. The subtractor circuitry 512 has two input terminals and an output terminal. The first input terminal of the subtractor circuitry 512 is coupled to the fourth terminal of the hall effect sensor 203. The second input terminal of the subtractor circuitry 512 is coupled to the fourth terminal of the hall effect sensor 506. The output terminal of the subtractor circuitry 512 is coupled to the second input terminal of the amplifier 450.

Although there are example coils 401, 502 implemented near the hall effect sensors 208, 501 for the purposes of determining change in gain, the magnetic field generated by the coils 401, 502 can have an affect and/or be sensed by the hall effect sensors 203, 506. Accordingly, the example coils 514, 516 have been implemented near the hall effect sensors 203, 506 to generate magnetic field opposite of the magnetic field leaked from the coils 401, 502 to compensate, reduce, and/or remove the effect of the magnetic field generated by the coils 401, 502. The effect on the hall effect sensors 203, 506 from the magnetic field generated by the coils 401, 502 results in a square wave at the output signal of the output amplifier 528.

Accordingly, the example coil compensation circuitry 518 identifies the effect by sensing the amplitude of the square wave at the output signal of the output amplifier 528 and applying a current to the coils 514, 516 to mitigate the leaked magnetic field until the square wave at the output signal is eliminate and/or reduced by more than a threshold. The coil compensation circuitry 518 is coupled to the output signal of the amplifier 528 and to the coils 514, 516. For example, the compensation circuitry 518 can determine that there is a square wave at the output terminal of the amplifier 528 and may apply a bias current to coils 516, 514 based on the amplitude of the square wave. The compensation circuitry 518 can continue to measure the output voltage to adjust the bias currents applied to the coils 516, 514 to sufficiently, e.g., within a threshold amount, reduce the effect of the leaked magnetic field from the coils 401, 502.

The on-chip heater circuitry 519 is implemented in the hall effect sensor circuitry 500 to heat up the silicon of the hall effect sensor circuitry 500 for testing purposes.

The pre-charge buffer 520 of FIG. 5 isolates the ADC 406 from the amplifiers 450, 528. The pre-charge buffer 520 has an input terminal and an output terminal. The input terminal of the pre-charge buffer 520 is coupled to the amplifiers 450, 528, the offset reduction circuitry 221, and the over current detection circuitry 524. The output terminal of the pre-charge buffer 520 is coupled to the second input terminal of the subtractor circuitry 402. The ADC 406 may have one or more sampling capacitors. A small ripple in the time domain occurs responsive to due to the time it takes to charge and discharge such sampling capacitors. Accordingly, the pre-charge buffer 520 isolates the amplifiers 450, 528 from the ADC 406 to reduce any possible ripples. In some examples, a pre-charge buffer can be added wherever an ADC is implemented. For example, a pre-charge buffer can be added at the first input terminal of the offset reduction circuitry 221 (e.g., if implemented with an ADC) to isolate the ADC of the offset reduction circuitry 221 from the other components of the hall effect sensor circuitry 500.

The temperature sensor 522 of FIG. 5 senses a temperature on and/or near the silicon of the hall effect sensor circuitry 500. The temperature sensor 522 has three terminals. The first terminal of the temperature sensor 522 is coupled to the residual offset trim circuitry 214. The second terminal of the temperature sensor 522 is coupled to the ADC 406. The third terminal of the temperature sensor 522 is coupled to the digital circuitry 408. The temperature sensor provides the temperature to the residual offset trim circuitry 214, the ADC 406 and/or the digital circuitry 408 to aide in their respective functionalities. For example, the sensed temperature can be used to adjust a temperature coefficient of the ADC 406 to compensate for thermal expansion of the package that corresponds to the hall effect sensor circuitry 500. In this manner, the ADC 406 can use the sensed temperature to compensate for magnetic signal changes. The digital circuitry 408 can use the sensed temperature to identify a potential fault responsive to the temperature and digital value not corresponding to an expected result. If a fault is identified, the digital circuitry 408 output signals a fault signal to a fault terminal of the hall effect sensor circuitry 500. The example residual offset trim circuitry 214 can use the sensed temperature for a temperature coefficient used to generate the output signal of the offset trim circuitry 214.

The over current detection circuitry 524 of FIG. 5 identifies a measured current being above a threshold. The measured current is the current from the input terminal 102 to the output terminal 104. The over current detection circuitry 524 has a first input terminal, a second input terminal, and an output terminal. The first input terminal of the over current detection circuitry 524 is coupled to a voltage over current (VOC) terminal of the hall effect sensor circuitry 500. The VOC terminal is a terminal that a customer and/or device can use to provide a signal (e.g., a voltage) that corresponds to the threshold (e.g., a threshold amount of current used to trigger an alert). The second input terminal of the over current detection circuitry 524 is coupled to the first input terminal off the offset reduction circuitry 221, the output terminal of the amplifier 450, the first input terminal of the amplifier 528, and the input terminal off the buffer 520. The output terminal of the over current detection circuitry 524 is coupled to an OC terminal of the hall effect sensor circuitry 500. The OC terminal can be used to trigger an alert responsive to the measured current being above the threshold.

The overcurrent detection circuitry 524 can identify the measured current being above the threshold, at a speed that depends on the bandwidth of the hall effect sensor circuitry 500. Accordingly, limiting the bandwidth of the hall effect sensor circuitry 500, limits the speed at which the hall effect sensor circuitry 500 can identify overcurrent (e.g., the measured current being above the threshold). However, because the hall effect sensor circuitry 500 has full bandwidth, the speed of the overcurrent detection circuitry 524 is not limited. Because the offset reduction circuitry 221 mitigates the offset of the hall effect sensors 203, 506, the overcurrent detection circuitry 524 can identify an overcurrent based on the output signal of the amplifier 450 because the output signal of the amplifier 450 is offset free. Thus, the overcurrent detection circuitry 524 can detect overcurrent independent of the bandwidth of the output amplifier 528. Responsive to detecting an overcurrent, the overcurrent detection circuitry 524 provides a signal indicative of the overcurrent detection to the OC terminal.

The reference circuitry 526 of FIG. 5 enables a user, customer, and/or device to program and/or set the reference voltage of the output amplifier 528. The reference circuitry 526 has an input terminal and an output terminal. The input terminal of the reference circuitry 526 is coupled to the VREF terminal of the hall effect sensor circuitry 500. The output terminal of the reference circuitry 526 is coupled to the second input terminal of the output amplifier 528. The user, customer, and/or device can transmit a signal to the reference circuitry 526. The reference circuitry 526 provides a signal to control the reference voltage of the output amplifier 528 responsive to the signal from the user, customer, and/or device.

Figure 6:
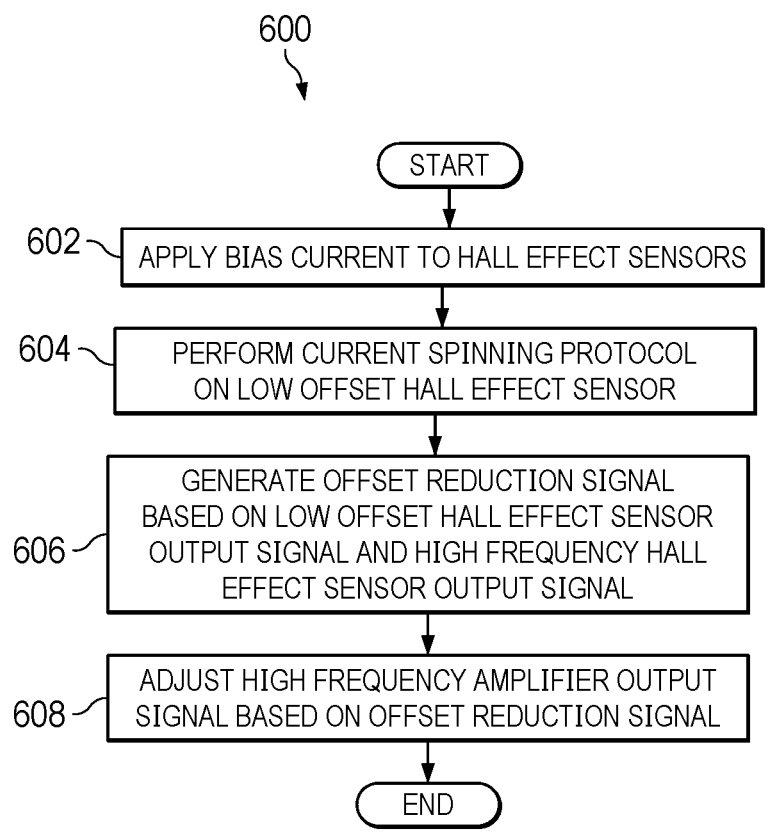
FIGS. 6-9 are flowcharts representative of a method and/or operations that may be executed to implement hall effect sensor circuitries of FIGS. 1A, 1B, 2, 3, 4A, 4B, and/or 5.

FIG. 6 is a flowchart representative of a method, example machine readable instructions, and/or example operations 600 that may be executed, instantiated, and/or performed by programmable circuitry and/or the hall effect sensor circuitries 200, 300, 400, 460, 500 to reduce offset of the hall effect sensor 203 and/or 506 of FIGS. 2-5. Although FIG. 6 is described in conjunction with the hall effect senor circuitry 500 of FIG. 5, the flowchart may be described in conjunction with any of the hall effect sensor circuitries of FIGS. 2-5. The example method and/or the example operations 600 of FIG. 6 begin at block 602, at which example current sources 204, 210, 504, and/or 507 apply a bias current to the hall effect sensors 203, 208, 501, and/or 506.

At block 604, the switch network 211 performs a current spinning protocol on the low offset hall effect sensor(s) 208 and/or 501. As described above, the switch network 211 enables and/or disables a plurality of switches to adjust the input/outputs of the hall effect sensors 208, 501. With each phase/rotation of the input/outputs the offset is applied with different polarities. In this manner, summing the output of the four phases results in a signal where the offset is cancelled out. At block 606, the offset reduction circuitry 221 generates an offset reduction signal responsive to the signal from the low offset hall effect sensor output (e.g., output by the amplifier 212, 452) and the output signal from the higher request hall effect sensor output (e.g., output by the amplifier 206, 450). For example, as described above the output signal of the amplifier 212, 452 has no or limited offset due to the current spinning technique applied to the hall effect sensor(s) 208, 501. Whereas, the output of the amplifier 206, 405 includes an offset because no current spinning was applied to the hall effect sensor(s) 203, 506. Thus, the offset reduction circuitry 221 determines a difference between the two signal over a period of time using the example integrator 222 and/or the example ADC 301, digital circuitry 302, DAC 304, as further described above. At block 608, the example offset reduction circuitry 221 adjusts the high frequency amplifier 206, 450 output based on the offset reduction signal. For example, the offset reduction signal is provided to the amplifier 206, 450 to adjust and/or compensate for the offset of the hall effect sensor 203 by adjusting the input offset voltage of the amplifier(s) 206, 450. As described above, the offset reduction signal is an analog signal that corresponds to the amount of offset included in the output signal of the non-spun hall sensor(s) 203, 506.

Figure 7:
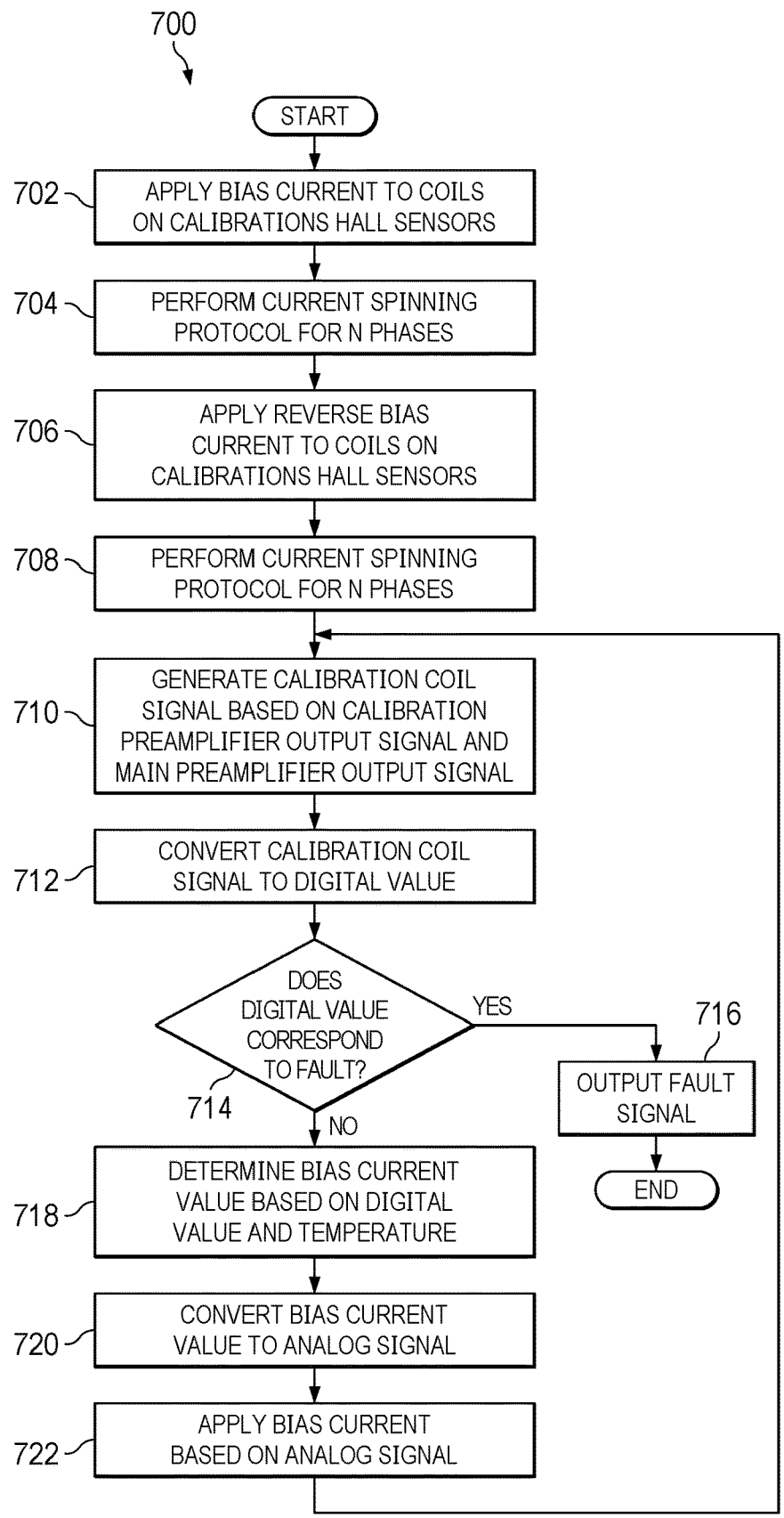

FIG. 7 is a flowchart representative of a method, example machine readable instructions, and/or example operations 700 that may be executed, instantiated, and/or performed by programmable circuitry and/or the hall effect sensor circuitries 200, 300, 400, 460, 500 to compensate for changes in gain of the hall effect sensor(s) 203, 208, 501, 506 of FIGS. 2-5. Although FIG. 7 is described in conjunction with the hall effect senor circuitry 500 of FIG. 5, the flowchart may be described in conjunction with any of the hall effect sensor circuitries of FIGS. 2-5. The example method and/or the example operations 700 of FIG. 7 begin at block 702, at which a bias current is applied to the coil(s) 401, 502 of the calibration hall sensor(s) 208, 501. A voltage and/or current source may be used to apply the current to the coil(s) 401, 502. In some examples, as described above, the applied current through the coils(s) 401, 502 generates a magnetic field that affects the hall effect sensor(s) 203, 506. In such examples, the coil compensation circuitry 518 identifies the effect at the output signal of the output amplifier 528 and applies a current to the coil(s) 514, 516 to mitigate the effect.

At block 704, the switch network 211 performs a current spinning protocol on the low offset hall effect sensor(s) 208 and/or 501. As described above, the switch network 211 enables and/or disables a plurality of switches to adjust the input/output terminals of the hall effect sensors 208, 501. With each phase/rotation of the input/output terminals the offset is applied with different polarities. In this manner, summing the output signal of the four phases results in a signal where the offset is cancelled out. Applying the bias current to the coil(s) 401, 502 amplifies the gain of the hall effect sensor(s) 208, 501. Accordingly, at block 706, a reverse bias current is applied to the coil(s) 401, 502. The reverse bias current is the same current that is applied at block 702 but in the opposite direction. The amplified gain signal reverses polarity responsive to the reversing of the bias current. In this manner, the offset reduction circuitry 221 can process the output signal of the amplifier 452 across the two phases (e.g., applying bias current and applying reverse bias current) to cancel out the effect of the gain signal generated by the coil(s) 401, 502 responsive to determining the offset of the hall effect sensors 203, 506. In some examples, as described above, the applied current through the coils(s) 401, 502 generates a magnetic field that affects the hall effect sensor(s) 203, 506. In such examples, the coil compensation circuitry 518 identifies the effect at the output signal of the output amplifier 528 and applies a reverse current to the coil(s) 514, 516 to mitigate the effect.

At block 708, the switch network 211 performs a current spinning protocol on the low offset hall effect sensor(s) 208 and/or 501 as the reverse bias current is applied to the coil(s) 401, 502 so that the offset reduction circuitry 221 can determine the offset without the gain signal generated by the coil(s) 401, 502. At block 710, the subtractor circuitry 402 generates a calibration signal based on (e.g., a difference between) the output signal of the amplifier 450 and the output signal of the amplifier 452. Because the hall effect sensor(s) 208, 501 sense the magnetic field due to the coil(s) 401, 502, the output signal of the amplifier 452 amplifies the magnetic field due to the coil(s) 401, 502. Whereas, the output signal of the amplifier 450 does not amplify the magnetic field due to the coil(s) 401, 502. Accordingly, subtracting the output signal of the amplifier 450 with the output signal of the amplifier 452 results in a calibration coil signal corresponding to the gain of the hall effect sensor(s) 203, 506, 208, 501.

At block 712, the ADC 406 of the gain calibration circuitry 404 converts the calibration coil signal into one or more digital values (e.g., over a duration of time). At block 714, the digital circuitry 408 determines if the digital value(s) correspond to a fault. For example, the digital circuitry 408 determines that a fault exists responsive to the digital value(s) being outside of expected patterns. In some examples, the digital circuitry 408 utilizes temperature information provided by the temperature sensor 522 to determine whether the digital values correspond to a fault. If the digital circuitry 408 determines that the digital value(s) correspond to a fault (block 714: YES), the digital circuitry 408 provides a fault signal via a fault terminal (block 716). If the digital circuitry 408 determines that the digital value(s) does not correspond to a fault (block 714: NO), the digital circuitry 280 determines a bias current value (e.g., an amount of bias current) to apply to the hall effect sensors 203, 208, 501, 506 based on the digital values and/or temperature values (block 718).

At block 720, the example DAC 410 converts the bias current value into one or more analog signals. In some examples, the analog signal is the bias current that is applied to the hall effect sensor(s) 203, 208, 501, 506. In some examples, the analog signal is provided to the current sources 204, 210, 504, 507 to generate a corresponding bias current to apply to the hall effect sensor(s) 203, 208, 501, 506. Accordingly, at block 722, the current sources 204, 210, 504, 507 apply the bias current to the hall effect sensor(s) 203, 208, 501, 506 based on the analog signal. As further described above, a change in gain is identified based on an output signal at the output terminal of the subtractor circuitry 402 which is applied to the gain calibration circuitry 404 to adjust the bias current to compensate for the change in gain.

Figure 8:
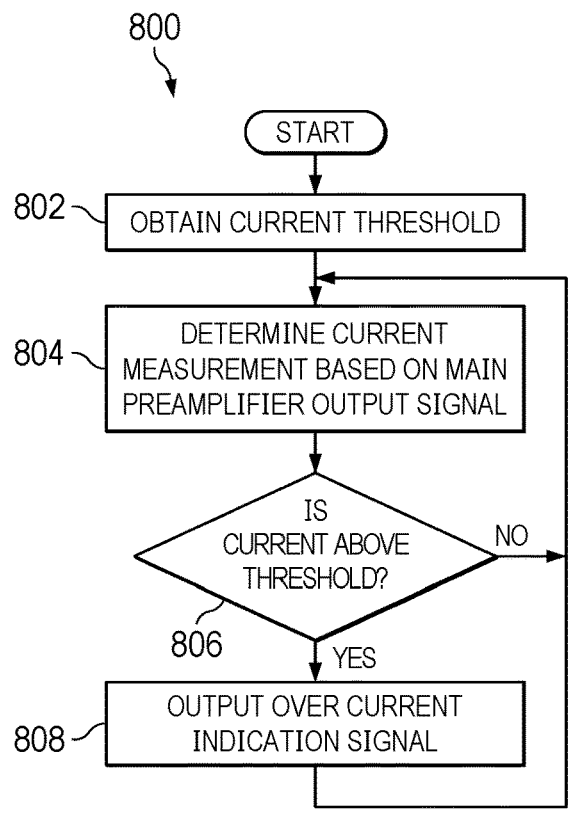

FIG. 8 is a flowchart representative of a method, example machine readable instructions, and/or example operations 800 that may be executed, instantiated, and/or performed by programmable circuitry and/or the over current detection circuitry 524 to identify the current measured by the hall effect sensor(s) 203, 208, 501, 506 of FIGS. 2-5 being above a threshold. Although FIG. 8 is described in conjunction with the hall effect senor circuitry 500 of FIG. 5, the flowchart may be described in conjunction with any of the hall effect sensor circuitries of FIGS. 2-5. The example method and/or the example operations 800 of FIG. 8 begin at block 802, at which the over current detection circuitry 524 obtains a current threshold from a signal obtained via a terminal (e.g., the VOC terminal of FIG. 5). The signal may be set by a user, manufacturer, and/or device.

At block 804, the over current detection circuitry 524 determines the current measured by the hall effect sensor(s) 203, 506 based on the output voltage of the amplifier 206, 450. At block 806, the over current detection circuitry 524 compares the determined current to the obtained current threshold do determine if the determined current is above the threshold. If the over current detection circuitry 524 determines that the current is not above the threshold (block 806: NO), control returns to block 804 for continued current measurements. If the over current detection circuitry 524 determines that the current is above the threshold (block 806: YES), the over current detection circuitry 524 provides an over current indication signal (e.g., via the OC terminal) to indicate that the measured current is above the threshold (block 808). The indication can be used to perform mitigating actions to avoid damage associated with the over current. After block 808, control returns to block 804.

Figure 9:
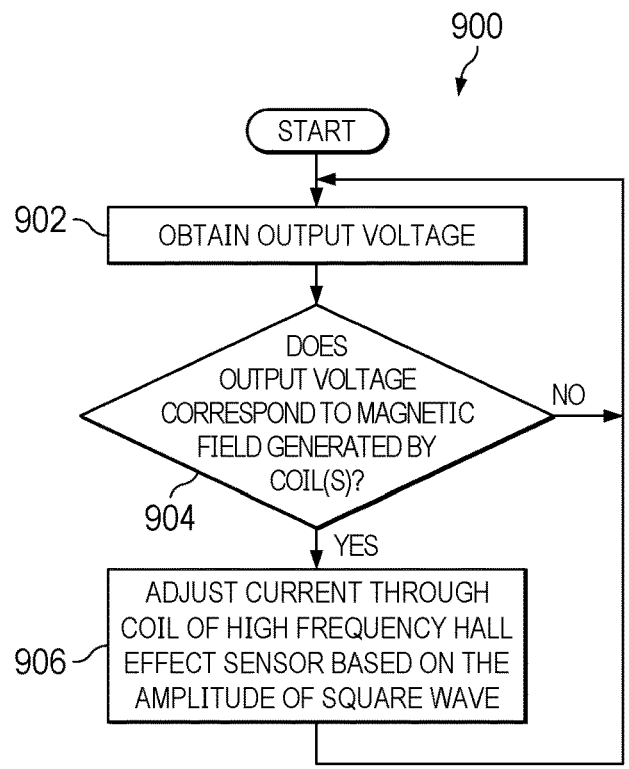

FIG. 9 is a flowchart representative of a method, example machine readable instructions, and/or example operations 900 that may be executed, instantiated, and/or performed by programmable circuitry and/or the coil compensation circuitry 518 to identify compensate for the magnetic field generated by the coil(s) 401, 502 that affects the hall effect sensor(s) 203, 506. Although FIG. 9 is described in conjunction with the hall effect senor circuitry 500 of FIG. 5, the flowchart may be described in conjunction with any of the hall effect sensor circuitries of FIGS. 2-5. The example method and/or the example operations 900 of FIG. 9 begin at block 902, at which the coil compensation circuitry 518 obtains an output voltage at the output terminal of the output amplifier 528. As further described below, the magnetic field generated by the coil(s) 401, 502 can be sensed by the hall effect sensor 203, 506. Accordingly, the leaked magnetic field is amplified by both the amplifier 450 and the amplifier 528 resulting in a square wave on top of the output signal. Accordingly, the coil compensation circuitry 518 can determine if the hall effect sensor is also sensing the magnetic field associated with the coil(s) 401, 502 based on whether the output signal includes a square wave that corresponds to the modulation of the coils (e.g., in the first direction and reverse direction).

If the example coil compensation circuitry 518 determines that the output voltage does not correspond to a magnetic field generated by the coil(s) 401, 502 (e.g., if the output voltage includes a square wave that corresponds to the coil modulation scheme) (block 904: NO), control returns to block 902. If the example coil compensation circuitry 518 determines that the output voltage corresponds to a magnetic field generated by the coil(s) 401, 502 (e.g., if the output voltage includes a square wave that corresponds to the coil modulation scheme) (block 904: YES), the coil compensation circuitry 518 adjusts the amount of current that is passed through the coil(s) 514, 516 to mitigate and/or otherwise reduce the effect of the magnetic field associated with the coils(s) 401, 502 (block 906). After block 906, the coil compensation circuitry 518 returns to block 902. If the coil compensation circuitry 518 over or under compensates, the amount of compensation can be adjusted during a subsequent iteration of measuring the output voltage.

FIG. 10 illustrates example graphs 1000, 1002, 1004, 1006, 1008, 1010, 1012, 1014 that illustrate an amount of offset in the frequency and/or time domain. The graphs 1000, 1002 represent the unspun offset in the frequency domain and the time domain at the output signal of the hall effect sensor(s) 203, 506. The graph 1000 illustrates that the output signal of the hall effect sensor(s) 203, 506 experiences an offset at 0 Hz (e.g., direct current frequency) in which the output signal of the hall effect senso(s) 203, 506 corresponds to full bandwidth (0 Hz to +1 megaHz). The graph 1002 illustrates the offset the hall effect sensor(s) 203, 506 have with respect to time. The graph 1002 includes a constant undesirable offset that is included in the output signal of the hall effect sensor(s) 203, 506.

The graphs 1004, 1006 represent the spun offset in the frequency domain and the time domain at the output terminal of the hall effect sensor(s) 208, 501. The graph 1004 illustrates that the output signal of the hall effect sensor(s) 208, 501 experiences an offset at a frequency of the current spinning protocol Hz in which the signal corresponds to full bandwidth (0 Hz to +1 megaHz). The graph 1006 illustrates the offset the hall effect sensor(s) 208, 501 have with respect to time as current spinning occurs for eight phases. The graph 1006 illustrates the different offsets associated with applying the current to the different terminals of the hall effect sensor(s) 208, 501. As shown in 1006, the offset of each phase is countered by an offset with an opposite polarity.

The graphs 1008, 1010 represent the output signal of the offset reduction circuitry 221 (e.g., that is applied to adjust the gain of the main amplifier 206, 450) in the frequency and/or time domain. The graph 1008 illustrates that the output signal of the offset reduction circuitry 221 produces an offset at 0 Hz (e.g., direct current frequency). The graph 1010 illustrates the output signal of the offset reduction circuitry 221 with respect to time. As described above, the offset signal provided by the offset reduction circuitry 221 is applied to the amplifier 450 to reduce and/or otherwise eliminate the offset of the hall effect sensor(s) 203, 506, by adjusting the total input offset of the amplifier 206, 450.

The graphs 1012, 1014 illustrate the effect of the offset on the output signal of the output amplifier 528 in the frequency and/or time domain. As shown in graph 1012, because the offset reduction circuitry 221 reduces and/or eliminates the offset by adjusting the amplifier 450, the output signal of the amplifier 528 experiences little to no offset across the full bandwidth. The graph 1014 illustrates the output offset decreasing to 0 after a settling time (e.g., after the hall effect sensor circuitry is first powered up. As shown in the graph 1014, the offset exists at startup, but as the offset reduction circuitry 221 begins mitigation, the offset is reduced to zero or nearly zero after the settling time.

FIG. 11 illustrates an additional benefit of described examples. FIG. 11 includes an example noise shaping graph 1100 that illustrates output noise with respect to frequency. The example graph 1100 of FIG. 11 includes a first example noise plot 1102 for a hall effect sensor circuitry without current spinning and without the use of offset reduction and a second example noise plot 1104 corresponding to offset reduction as described. FIG. 11 further includes an area 1106 illustrating the reduction in flicker noise at low frequencies using described examples. A high frequency hall effect sensor without current spinning includes flicker noise. The offset reduction circuitry 221 removes the flicker noise due to auto-zeroing operation(s) as shown by the flicker reduction area 1106 between the two plots 1102, 1104.

Figure 12A:
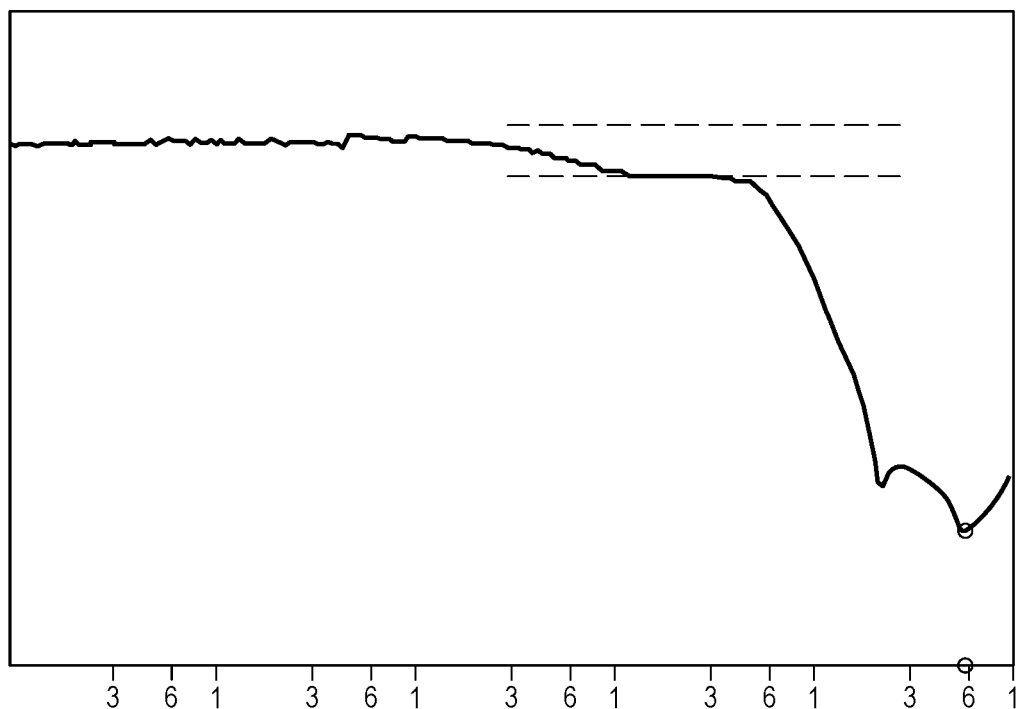
FIG. 12A is a diagram illustrating a frequency response of some hall effect sensor circuitries.

FIGS. 12A and 12B illustrate a frequency response and/or bandwidth measurement for alternative techniques that do not utilize the described offset reduction circuitry. For example, the alternative techniques may include using a high frequency path for high frequency signals and a low frequency path for low frequency signals (also referred to as frequency stitching) to attempt to achieve full bandwidth. FIG. 12A includes an example frequency response plot 1200 and FIG. 12B includes an example bandwidth plot 1210. The bandwidth plot 1210 includes example notches 1212.

As shown in the frequency response plot 1200, the gain of the alternative techniques experiences gain glitches that can result in a gain error of up to 25%. Also, the frequency response plot 1200 corresponds a reduction of gain in higher frequencies. Thus, the alternative techniques are not reliable for higher frequency signals. As shown in the bandwidth plot 1210, the notches 1212 (e.g., in-band notches) occur resulting in almost 100% gain error. Examples herein eliminate in-band notches and have a more stable frequency response with less gain drop off than such alternative techniques.

An example manner of implementing the hall effect sensor circuitry 100 and/or the hall effect sensor circuitry 101 of FIGS. 1A and/or 1B is illustrated in FIGS. 2-5. However, one or more of the elements, processes and/or devices illustrated in FIGS. 2-5 may be combined, divided, re-arranged, omitted, eliminated and/or implemented in any other way.

Further, the bias current sources 204, 210, 504, 507, the switch network 211, the amplifiers 206, 212, 224, 450, 452, 454, 528, the residual trim offset circuitry 214, the offset reduction circuitry 221, the integrator 222, the ADCs 301, 406, the digital circuitry 302, 408, the DAC 304, 410, the subtractor circuitry 402, 505, 512, the gain calibration circuitry 404, the coil compensation circuitry 518, the on-chip heater 519, the buffer 520, the temperature sensor 522, the over current detection circuitry 524, the reference circuitry 526, and/or, more generally, one or more of the hall effect sensor circuitries 200, 300, 400, 460, 500 of FIGS. 2-5 may be implemented by hardware, software, firmware and/or any combination of hardware, software and/or firmware. As a result, for example, any of the bias current sources 204, 210, 504, 507, the switch network 211, the amplifiers 206, 212, 224, 450, 452, 454, 528, the residual trim offset circuitry 214, the offset reduction circuitry 221, the integrator 222, the ADCs 301, 406, the digital circuitry 302, 408, the DAC 304, 410, the subtractor circuitry 402, 505, 512, the gain calibration circuitry 404, the coil compensation circuitry 518, the on-chip heater 519, the buffer 520, the temperature sensor 522, the over current detection circuitry 524, the reference circuitry 526, and/or, more generally, one or more of the hall effect sensor circuitries 200, 300, 400, 460, 500 of FIGS. 2-5 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)).

When reading any of the apparatus or system claims of this patent to cover a purely software and/or firmware implementation, at least one of the bias current sources 204, 210, 504, 507, the switch network 211, the amplifiers 206, 212, 224, 450, 452, 454, 528, the residual trim offset circuitry 214, the offset reduction circuitry 221, the integrator 222, the ADCs 301, 406, the digital circuitry 302, 408, the DAC 304, 410, the subtractor circuitry 402, 505, 512, the gain calibration circuitry 404, the coil compensation circuitry 518, the on-chip heater 519, the buffer 520, the temperature sensor 522, the over current detection circuitry 524, the reference circuitry 526, and/or, more generally, one or more of the hall effect sensor circuitries 200, 300, 400, 460, 500 of FIGS. 2-5 is/are hereby expressly defined to include a non-transitory computer readable storage device or storage disk such as a memory, a digital versatile disk (DVD), a compact disk (CD), a Blu-ray disk, etc., including the software and/or firmware. Further still, the bias current sources 204, 210, 504, 507, the switch network 211, the amplifiers 206, 212, 224, 450, 452, 454, 528, the residual trim offset circuitry 214, the offset reduction circuitry 221, the integrator 222, the ADCs 301, 406, the digital circuitry 302, 408, the DAC 304, 410, the subtractor circuitry 402, 505, 512, the gain calibration circuitry 404, the coil compensation circuitry 518, the on-chip heater 519, the buffer 520, the temperature sensor 522, the over current detection circuitry 524, the reference circuitry 526, and/or, more generally, one or more of the hall effect sensor circuitries 200, 300, 400, 460, 500 of FIGS. 2-5 may include one or more elements, processes and/or devices in addition to, or instead of, those illustrated in FIGS. 2-5, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

Flowcharts representative of circuit operation, example hardware logic, machine-readable instructions, hardware implemented state machines, and/or any combination thereof for implementing one or more of the hall effect sensor circuitries 200, 300, 400, 460, 500 of FIGS. 2-5.

Further, although the example circuit operation is described with reference to the flowchart illustrated in FIGS. 6-9, many other methods of implementing hall effect sensor circuitries 200, 300, 400, 460, 500 of FIGS. 2-5 may alternatively be used. For example, the order of execution of the blocks may be changed, and/or some of the blocks described may be changed, eliminated, or combined.

From the foregoing, example methods, apparatus, and articles of manufacture have been described to improve accuracy and/or efficiency of current limit circuitry. The described methods, apparatus and articles of manufacture improve the accuracy and/or efficiency of current limit circuitry using a diode-connected device, a current source, and a comparator.

Although certain example methods, apparatus, and articles of manufacture have been described, the scope of coverage of this patent is not limited thereto. On the contrary, this patent covers all methods, apparatus, and articles of manufacture fairly falling within the scope of the claims of this patent.

Descriptors "first," "second," "third," etc. are used herein when identifying multiple elements or components which may be referred to separately. Unless otherwise specified or known based on their context of use, such descriptors do not impute any meaning of priority, physical order, or arrangement in a list, or ordering in time but are merely used as labels for referring to multiple elements or components separately for ease of understanding the described examples. In some examples, the descriptor "first" may be used to refer to an element in the detailed description, while the same element may be referred to in a claim with a different descriptor such as "second" or "third." In such instances, it should be known that such descriptors are used merely for ease of referencing multiple elements or components.

In the description and in the claims, the terms "including" and "having" and variants thereof are intended to be inclusive in a manner similar to the term "comprising" unless otherwise noted. Unless otherwise stated, "about," "approximately," or "substantially" preceding a value means+/−10 percent of the stated value. In another example, "about," "approximately," or "substantially" preceding a value means+/−5 percent of the stated value. In another example, "about," "approximately," or "substantially" preceding a value means+/−1 percent of the stated value.

The term "couple", "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple," "coupled", "couples", or variants thereof, includes an indirect or direct electrical or mechanical connection.

The terms "calibration," "calibrate,", "calibrates" and variants thereof, as used herein can be used interchangeably with the terms "compensation," "compensate", "compensates," and variants thereof.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Although not all separately labeled in the FIGS. 1A-5, components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes. However, in some instances, "terminal," "node," "interconnect," "pad," and "pin" may be used interchangeably.

Modifications are possible in the described examples, and other examples are possible, within the scope of the claims.

What is claimed is:

1. A circuit comprising:
   a first hall effect sensor having a first terminal, a second terminal, and a third terminal;
   a first amplifier having a first input terminal, a second input terminal, a third input terminal, and an output terminal, the first input terminal of the first amplifier coupled to the first terminal of the first hall effect sensor, the second input terminal of the first amplifier coupled to the second terminal of the first hall effect sensor;
   a second hall effect sensor having a first terminal, a second terminal, and a third terminal;
   a second amplifier having a first input terminal, a second input terminal, and an output terminal, the first input terminal of the second amplifier coupled to the first terminal of the second hall effect sensor, the second input terminal of the second amplifier coupled to the second terminal of the second hall effect sensor;
   subtractor circuitry having a first input terminal, a second input terminal, and an output terminal, the first input terminal of the subtractor circuitry coupled to the output terminal of the first amplifier, the second input terminal of the subtractor circuitry coupled to the output terminal of the second amplifier;
   offset reduction circuitry having a first input terminal, a second input terminal, and an output terminal, the first input terminal of the offset reduction circuitry coupled to the output terminal of the first amplifier and the first input terminal of the subtractor circuitry, the second input terminal of the offset reduction circuitry coupled to the output terminal of the second amplifier and the second input terminal of the subtractor circuitry, the output terminal of the offset reduction circuitry coupled to the third input terminal of the first amplifier; and
   gain calibration circuitry having an input terminal, a first output terminal, and a second output terminal, the input terminal of the gain calibration circuitry coupled to the output terminal of the subtractor circuitry, the first output terminal of the gain calibration circuitry coupled to the third terminal of the first hall effect sensor, the second output terminal of the gain calibration circuitry coupled to the third terminal of the second hall effect sensor.

2. The circuit of claim 1, wherein the offset reduction circuitry is configured to reduce an offset of the first hall effect sensor.

3. The circuit of claim 1, wherein the gain calibration circuitry is configured to determine a change in gain of at least one of the first hall effect sensor or the second hall effect sensor.

4. The circuit of claim 3, wherein the gain calibration circuitry is configured to adjust a bias current for the at least one of the first hall effect sensor or the second hall effect sensor based on the change in the gain.

5. The circuit of claim 4, further including a switch network to adjust which terminal of the second hall effect sensor the bias current is applied to.

6. The circuit of claim 1, further including a third amplifier having an input terminal and an output terminal, the input terminal of the third amplifier coupled to the output terminal of the first amplifier.

7. The circuit of claim 1, further including over current detection circuitry having an input terminal coupled to the output terminal of the first amplifier.

8. The circuit of claim 1, further including a buffer, the output terminal of the first amplifier coupled to the second input terminal of the subtractor circuitry via the buffer.

9. The circuit of claim 1, wherein the gain calibration circuitry includes:
an analog-to-digital converter having an input terminal and an output terminal, the input terminal of the analog-to-digital converter coupled to the output terminal of the subtractor circuitry;
digital circuitry having an input terminal and an output terminal, the input terminal of the digital circuitry coupled to the output terminal of the analog-to-digital converter; and
a digital-to-analog converter having an input terminal, a first output terminal, and a second output terminal, the input terminal of the digital-to-analog converter coupled to the output terminal of the digital circuitry, the first output terminal of the digital-to-analog converter coupled to the third terminal of the first hall effect sensor, the second output terminal of the digital-to-analog converter coupled to the third terminal of the second hall effect sensor.

10. A circuit comprising:
a first hall effect sensor having a first terminal, a second terminal, and a third terminal;
a first amplifier having a first input terminal, a second input terminal, a third input terminal, and an output terminal, the first input terminal of the first amplifier coupled to the first terminal of the first hall effect sensor, the second input terminal of the first amplifier coupled to the second terminal of the first hall effect sensor;
a second hall effect sensor having a first terminal, a second terminal, and a third terminal;
a second amplifier having a first input terminal, a second input terminal, and an output terminal, the first input terminal of the second amplifier coupled to the first terminal of the second hall effect sensor, the second input terminal of the second amplifier coupled to the second terminal of the second hall effect sensor; and
offset reduction circuitry having a first input terminal, a second input terminal, and an output terminal, the first input terminal of the offset reduction circuitry coupled to the output terminal of the first amplifier, the second input terminal of the offset reduction circuitry coupled to the output terminal of the second amplifier, the output terminal of the offset reduction circuitry coupled to the third input terminal of the first amplifier.

11. The circuit of claim 10, wherein the offset reduction circuitry is configured to reduce an offset of the first hall effect sensor.

12. The circuit of claim 10, wherein the offset reduction circuitry is configured to reduce a flicker caused by spinning the second hall effect sensor.

13. The circuit of claim 10, further including a third amplifier having an input terminal and an output terminal, the input terminal of the third amplifier coupled to the output terminal of the first amplifier.

14. The circuit of claim 10, further including a first resistor and a second resistor, the output terminal of the first amplifier coupled to the first input terminal of the offset reduction circuitry via the first resistor and the output terminal of the second amplifier coupled to the second input terminal of the offset reduction circuitry via the second resistor.

15. The circuit of claim 10, wherein the offset reduction circuitry includes integrator circuitry.

16. The circuit of claim 10, wherein the offset reduction circuitry includes:
an analog-to-digital converter having a first input terminal, a second input terminal and an output terminal, the first input terminal of the analog-to-digital converter coupled to the output terminal of the first amplifier, and the second input terminal of the analog-to-digital converter coupled to the output terminal of the second amplifier;
digital circuitry having an input terminal and an output terminal, the input terminal of the digital circuitry coupled to the output terminal of the analog-to-digital converter; and
a digital-to-analog converter having an input terminal, and an output terminal, the input terminal of the digital-to-analog converter coupled to the output terminal of the digital circuitry, the output terminal of the digital-to-analog converter coupled to a third input terminal of the first amplifier.

17. An apparatus comprising:
a non-spun hall effect sensor having an output;
a first amplifier having a first input coupled to the output of the non-spun hall effect sensor, and having a second input and an output;
a spun hall effect sensor having an output;
a second amplifier having an input coupled to the output of the spun hall effect sensor, and having an output; and
offset reduction circuitry having a first input coupled to the output of first amplifier, a second input coupled to the output of the second amplifier, and an output coupled to the second input of the first amplifier, and configured to:
receive a first signal at the output of the first amplifier and a second signal at the output of the second amplifier, the first signal having an offset responsive to an offset of the non-spun hall effect sensor; and
generate an offset reduction signal at the output of the offset reduction circuitry.

18. The apparatus of claim 17, further including:
a coil configured to generate a magnetic signal near the spun hall effect sensor, the second signal including an effect from the magnetic signal;
subtractor circuitry configured to generate a coil signal by subtracting the first signal from the second signal, wherein the coil signal changes responsive to a gain of the spun hall effect sensor changing; and
gain calibration circuitry configured to adjust a bias current for at least one of the non-spun hall effect sensor or the spun hall effect sensor based on the coil signal.

19. The apparatus of claim 17, wherein the offset reduction circuitry is configured to generate the offset reduction signal based on an integration of the first signal and the second signal with respect to time.

20. The apparatus of claim 17, further including overcurrent detection circuitry configured to detect a current being above a threshold, in which the current is based on the first signal.

21. The apparatus of claim 17, wherein the offset reduction circuitry is configured to provide the offset reduction circuitry to the second input of the first amplifier to cause adjust an input offset voltage of the first amplifier to reduce the offset of the first signal.

22. A circuit comprising:
- a first hall effect sensor having a first terminal, a second terminal, and a third terminal;
- a first amplifier having a first input terminal, a second input terminal, and an output terminal, the first input terminal of the first amplifier coupled to the first terminal of the first hall effect sensor, the second input terminal of the first amplifier coupled to the second terminal of the first hall effect sensor;
- a second hall effect sensor having a first terminal, a second terminal, and a third terminal;
- a second amplifier having a first input terminal, a second input terminal, and an output terminal, the first input terminal of the second amplifier coupled to the first terminal of the second hall effect sensor, the second input terminal of the second amplifier coupled to the second terminal of the second hall effect sensor;
- subtractor circuitry having a first input terminal, a second input terminal, and an output terminal, the first input terminal of the subtractor circuitry coupled to the output terminal of the first amplifier, the second input terminal of the subtractor circuitry coupled to the output terminal of the second amplifier; and
- gain calibration circuitry having an input terminal, a first output terminal, and a second output terminal, the input terminal of the gain calibration circuitry coupled to the output terminal of the subtractor circuitry, the first output terminal of the gain calibration circuitry coupled to the third terminal of the first hall effect sensor, the second output terminal of the gain calibration circuitry coupled to the third terminal of the second hall effect sensor.

23. The circuit of claim 22, wherein:
- a first signal at the output terminal of the subtractor circuitry corresponds to a gain of at least one of the first hall effect sensor or the second hall effect sensor;
- a second signal at the first output terminal of the gain calibration circuitry corresponds to an amount of bias current to apply to the first hall effect sensor; and
- a third signal at the second output terminal of the gain calibration circuitry corresponds to an amount of bias current to apply to the second hall effect sensor, further including a switch network to adjust which terminal of the second hall effect sensor the bias current is applied to.

24. The circuit of claim 22, further including a third amplifier having an input terminal and an output terminal, the input terminal of the third amplifier coupled to the output terminal of the first amplifier.

25. The circuit of claim 22, further including over current detection circuitry including an input terminal coupled to the output terminal of the first amplifier.

26. The circuit of claim 22, wherein the gain calibration circuitry includes:
- an analog-to-digital converter having an input terminal and an output terminal, the input terminal of the analog-to-digital converter coupled to the output terminal of the subtractor circuitry;
- digital circuitry having an input terminal and an output terminal, the input terminal of the digital circuitry coupled to the output terminal of the analog-to-digital converter; and
- a digital-to-analog converter having an input terminal, a first output terminal, and a second output terminal, the input terminal of the digital-to-analog converter coupled to the output terminal of the digital circuitry, the first output terminal of the digital-to-analog converter coupled to the third terminal of the first hall effect sensor, the second output terminal of the digital-to-analog converter coupled to the third terminal of the second hall effect sensor.

* * * * *